United States Patent
Parsche et al.

(10) Patent No.: US 10,083,256 B2
(45) Date of Patent: Sep. 25, 2018

(54) CONTROL SYSTEM FOR EXTRACTION OF HYDROCARBONS FROM UNDERGROUND DEPOSITS

(71) Applicant: HARRIS CORPORATION, Melbourne, FL (US)

(72) Inventors: Francis Eugene Parsche, Palm Bay, FL (US); David M. Daniel, West Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 1094 days.

(21) Appl. No.: 13/943,894

(22) Filed: Jul. 17, 2013

(65) Prior Publication Data
US 2013/0304436 A1    Nov. 14, 2013

Related U.S. Application Data

(62) Division of application No. 12/893,685, filed on Sep. 29, 2010, now Pat. No. 8,511,378.

(51) Int. Cl.
G06F 7/60      (2006.01)
G06F 17/50     (2006.01)
(Continued)

(52) U.S. Cl.
CPC .......... G06F 17/5009 (2013.01); E21B 36/04 (2013.01); E21B 43/2401 (2013.01); E21B 43/2408 (2013.01)

(58) Field of Classification Search
CPC .. G06F 17/5009; E21B 36/04; E21B 43/2401; E21B 43/2408
(Continued)

(56) References Cited

U.S. PATENT DOCUMENTS

| | | |
|---|---|---|
| 2,371,459 A | 3/1945 | Mittelmann |
| 2,685,930 A | 8/1954 | Albaugh |

(Continued)

FOREIGN PATENT DOCUMENTS

| | | |
|---|---|---|
| CA | 1199573 | 1/1986 |
| CA | 2678473 | 8/2009 |

(Continued)

OTHER PUBLICATIONS

Kasevich et al. ("Pilot Testing of a Radio Frequency Heating System for Enhanced Oil Recovery From Diatomaceous Earth", 1994, Society of Petroleum Engineers, pp. 1-14).*

(Continued)

*Primary Examiner* — Omar Fernandez Rivas
*Assistant Examiner* — Iftekhar Khan
(74) *Attorney, Agent, or Firm* — Allen, Dyer, Doppelt, + Gilchrist, P.A.

(57) ABSTRACT

A control system for use in extracting hydrocarbons from an underground deposit is disclosed that comprises an electromagnetic heating system and a processor. The electromagnetic heating system is configured to heat the underground deposit to facilitate fluid flow of a resource for extraction from the underground deposit. The processor is configured to control the electromagnetic heating system in response to temperature data and pressure data for the underground deposit. The processor correlates the temperature data and pressure data with predetermined water phase characteristics to control the electromagnetic heating system so that substantially all water in the underground deposit is maintained in a liquid state. The control system may also generate voxel data corresponding to spatial characteristics of the underground deposit. The spatial characteristics may be presented as a map on a display.

25 Claims, 12 Drawing Sheets

(51) Int. Cl.
*E21B 36/04* (2006.01)
*E21B 43/24* (2006.01)

(58) Field of Classification Search
USPC .................................................. 703/2
See application file for complete search history.

(56) References Cited

U.S. PATENT DOCUMENTS

| | | | |
|---|---|---|---|
| 3,497,005 A | | 2/1970 | Pelopsky |
| 3,848,671 A | | 11/1974 | Kern |
| 3,954,140 A | | 5/1976 | Hendrick |
| 3,988,036 A | | 10/1976 | Fisher |
| 3,991,091 A | | 11/1976 | Driscoll |
| 4,035,282 A | | 7/1977 | Stuchberry et al. |
| 4,042,487 A | * | 8/1977 | Seguchi ............... B01J 19/087 204/155 |
| 4,087,781 A | | 5/1978 | Grossi et al. |
| 4,136,014 A | | 1/1979 | Vermeulen |
| 4,140,179 A | * | 2/1979 | Kasevich ............... E21B 36/04 166/248 |
| 4,140,180 A | * | 2/1979 | Bridges ............... E21B 36/04 166/245 |
| 4,144,935 A | | 3/1979 | Bridges et al. |
| 4,146,125 A | | 3/1979 | Sanford et al. |
| 4,196,329 A | | 4/1980 | Rowland et al. |
| 4,213,302 A | * | 7/1980 | Woinsky ............... F03G 7/04 60/641.3 |
| 4,279,125 A | * | 7/1981 | Woinsky ............... F03G 7/04 60/641.5 |
| 4,295,880 A | | 10/1981 | Horner |
| 4,300,219 A | | 11/1981 | Joyal |
| 4,301,865 A | | 11/1981 | Kasevich et al. |
| 4,328,324 A | | 5/1982 | Kock |
| 4,373,581 A | | 2/1983 | Toellner |
| 4,396,062 A | | 8/1983 | Iskander |
| 4,404,123 A | | 9/1983 | Chu |
| 4,410,216 A | | 10/1983 | Allen |
| 4,425,227 A | | 1/1984 | Smith |
| 4,449,585 A | | 5/1984 | Bridges et al. |
| 4,456,065 A | | 6/1984 | Heim |
| 4,457,365 A | * | 7/1984 | Kasevich ............... E21B 36/04 166/248 |
| 4,470,459 A | | 9/1984 | Copland |
| 4,485,869 A | * | 12/1984 | Sresty ............... E21B 43/2401 166/248 |
| 4,487,257 A | | 12/1984 | Dauphine |
| 4,508,168 A | | 4/1985 | Heeren |
| 4,514,305 A | | 4/1985 | Filby |
| 4,524,827 A | | 6/1985 | Bridges |
| 4,531,468 A | | 7/1985 | Simon |
| 4,583,586 A | | 4/1986 | Fujimoto et al. |
| 4,620,593 A | | 11/1986 | Haagensen |
| 4,622,496 A | | 11/1986 | Dattili |
| 4,645,585 A | | 2/1987 | White |
| 4,678,034 A | | 7/1987 | Eastlund |
| 4,703,433 A | | 10/1987 | Sharrit |
| 4,790,375 A | | 12/1988 | Bridges |
| 4,817,711 A | | 4/1989 | Jeambey |
| 4,882,984 A | | 11/1989 | Eves, II |
| 4,892,782 A | | 1/1990 | Fisher et al. |
| 5,046,559 A | | 9/1991 | Glandt |
| 5,055,180 A | | 10/1991 | Klaila |
| 5,065,819 A | | 11/1991 | Kasevich |
| 5,082,054 A | * | 1/1992 | Kiamanesh ............... E21B 36/04 166/248 |
| 5,136,249 A | | 8/1992 | White |
| 5,199,488 A | | 4/1993 | Kasevich |
| 5,233,306 A | | 8/1993 | Misra |
| 5,236,039 A | | 8/1993 | Edelstein |
| 5,251,700 A | | 10/1993 | Nelson |
| 5,293,936 A | | 3/1994 | Bridges |
| 5,304,767 A | | 4/1994 | McGaffigan |
| 5,315,561 A | | 5/1994 | Grossi |
| 5,370,477 A | | 12/1994 | Bunin |
| 5,378,879 A | | 1/1995 | Monovoukas |
| 5,506,592 A | | 4/1996 | MacDonald |
| 5,582,854 A | | 12/1996 | Nosaka |
| 5,621,844 A | | 4/1997 | Bridges |
| 5,631,562 A | | 5/1997 | Cram |
| 5,746,909 A | | 5/1998 | Calta |
| 5,910,287 A | | 6/1999 | Cassin |
| 5,923,299 A | | 7/1999 | Brown et al. |
| 6,045,648 A | | 4/2000 | Palmgren et al. |
| 6,046,464 A | | 4/2000 | Schetzina |
| 6,055,213 A | | 4/2000 | Rubbo |
| 6,063,338 A | | 5/2000 | Pham |
| 6,097,262 A | | 8/2000 | Combellack |
| 6,106,895 A | | 8/2000 | Usuki |
| 6,112,273 A | | 8/2000 | Kau |
| 6,184,427 B1 | | 2/2001 | Klepfer |
| 6,229,603 B1 | | 5/2001 | Coassin |
| 6,232,114 B1 | | 5/2001 | Coassin |
| 6,301,088 B1 | | 10/2001 | Nakada |
| 6,303,021 B2 | | 10/2001 | Winter |
| 6,348,679 B1 | | 2/2002 | Ryan et al. |
| 6,360,819 B1 | | 3/2002 | Vinegar |
| 6,415,864 B1 | | 7/2002 | Ramakrishnan et al. |
| 6,432,365 B1 | | 8/2002 | Levin |
| 6,438,261 B1 | * | 8/2002 | Moshe ............... G01N 15/1475 382/133 |
| 6,603,309 B2 | | 8/2003 | Forgang |
| 6,613,678 B1 | | 9/2003 | Sakaguchi |
| 6,614,059 B1 | | 9/2003 | Tsujimura |
| 6,649,888 B2 | | 11/2003 | Ryan et al. |
| 6,712,136 B2 | | 3/2004 | De Rouffignac |
| 6,808,935 B2 | | 10/2004 | Levin |
| 6,923,273 B2 | | 8/2005 | Terry |
| 6,932,155 B2 | | 8/2005 | Vinegar |
| 6,967,589 B1 | | 11/2005 | Peters |
| 6,992,630 B2 | | 1/2006 | Parsche |
| 7,046,584 B2 | | 5/2006 | Sorrells |
| 7,079,081 B2 | | 7/2006 | Parsche et al. |
| 7,091,460 B2 | | 8/2006 | Kinzer |
| 7,109,457 B2 | | 9/2006 | Kinzer |
| 7,115,847 B2 | | 10/2006 | Kinzer |
| 7,147,057 B2 | | 12/2006 | Steele |
| 7,171,310 B2 | | 1/2007 | Haugland |
| 7,172,038 B2 | | 2/2007 | Terry |
| 7,205,947 B2 | | 4/2007 | Parsche |
| 7,312,428 B2 | | 12/2007 | Kinzer |
| 7,322,416 B2 | | 1/2008 | Burris, II |
| 7,337,980 B2 | | 3/2008 | Schaedel |
| 7,438,807 B2 | | 10/2008 | Garner et al. |
| 7,441,597 B2 | * | 10/2008 | Kasevich ............... E21B 43/2401 166/247 |
| 7,456,632 B2 | | 11/2008 | Johnstad et al. |
| 7,461,693 B2 | * | 12/2008 | Considine ............... B08B 9/0933 166/248 |
| 7,484,561 B2 | * | 2/2009 | Bridges ............... E21B 43/2401 166/248 |
| 7,562,708 B2 | | 7/2009 | Cogliandro |
| 7,623,804 B2 | | 11/2009 | Sone |
| 8,128,786 B2 | * | 3/2012 | White ............... C10G 1/04 196/14.52 |
| 8,133,384 B2 | | 3/2012 | Parsche |
| 8,337,769 B2 | | 12/2012 | Parsche |
| 8,731,306 B2 | * | 5/2014 | Chertok ............... G06K 9/4671 345/660 |
| 8,789,599 B2 | * | 7/2014 | Parsche ............... E21B 43/2401 166/302 |
| 9,033,033 B2 | * | 5/2015 | Thomas ............... E21B 43/2401 166/248 |
| 9,242,190 B2 | * | 1/2016 | Patten ............... B01D 15/00 |
| 9,322,254 B2 | * | 4/2016 | Trautman ............... E21B 43/2401 |
| 9,328,243 B2 | * | 5/2016 | Parsche ............... C08L 95/00 |
| 9,664,021 B2 | * | 5/2017 | Hyde ............... E21B 43/2401 |
| 2002/0032534 A1 | | 3/2002 | Regier |
| 2004/0031731 A1 | | 2/2004 | Honeycutt |
| 2005/0199386 A1 | * | 9/2005 | Kinzer ............... E21B 43/2401 166/248 |
| 2005/0274513 A1 | | 12/2005 | Schultz |
| 2006/0038083 A1 | | 2/2006 | Criswell |

(56) References Cited

U.S. PATENT DOCUMENTS

| | | | |
|---|---|---|---|
| 2007/0108202 A1 | 5/2007 | Kinzer | |
| 2007/0131591 A1* | 6/2007 | Pringle | A61B 18/1815 |
| | | | 208/402 |
| 2007/0137852 A1 | 6/2007 | Considine et al. | |
| 2007/0137858 A1 | 6/2007 | Considine et al. | |
| 2007/0187089 A1 | 8/2007 | Bridges | |
| 2007/0261844 A1 | 11/2007 | Cogliandro et al. | |
| 2008/0091396 A1 | 4/2008 | Kennon et al. | |
| 2008/0143330 A1 | 6/2008 | Madio | |
| 2008/0073079 A1 | 8/2008 | Tranquilla et al. | |
| 2009/0009410 A1 | 1/2009 | Dolgin et al. | |
| 2009/0200016 A1 | 8/2009 | Goodwin et al. | |
| 2009/0242196 A1* | 10/2009 | Pao | E21B 43/2401 |
| | | | 166/248 |
| 2009/0260879 A1 | 10/2009 | Clark et al. | |
| 2010/0004866 A1 | 1/2010 | Rabinovich et al. | |
| 2010/0094605 A1 | 4/2010 | Hajibeygi et al. | |
| 2010/0219107 A1 | 9/2010 | Parsche | |
| 2011/0115787 A1* | 5/2011 | Kadlec | G01V 1/345 |
| | | | 345/419 |
| 2011/0309988 A1 | 12/2011 | Parsche | |
| 2012/0061080 A1 | 3/2012 | Sultenfuss et al. | |
| 2012/0067580 A1 | 3/2012 | Parsche | |
| 2012/0073798 A1* | 3/2012 | Parsche | E21B 36/04 |
| | | | 166/53 |
| 2013/0096039 A1 | 4/2013 | Parsche | |
| 2013/0204588 A1 | 8/2013 | Copeland | |
| 2013/0243250 A1* | 9/2013 | France | G01C 15/00 |
| | | | 382/103 |

FOREIGN PATENT DOCUMENTS

| | | |
|---|---|---|
| DE | 10 2008 022176 | 11/2009 |
| EP | 0135966 | 4/1985 |
| EP | 0387846 | 9/1990 |
| EP | 0418117 | 3/1991 |
| EP | 0563999 | 10/1993 |
| EP | 1106672 | 6/2001 |
| FR | 1586066 | 2/1970 |
| FR | 2925519 | 6/2009 |
| JP | 56050119 | 5/1981 |
| JP | 2246502 | 10/1990 |
| WO | 2007/133461 | 11/2007 |
| WO | 2008/011412 | 1/2008 |
| WO | 2008/030337 | 3/2008 |
| WO | 2008/098850 | 8/2008 |
| WO | 2009/027262 | 3/2009 |
| WO | 2009/114934 | 9/2009 |

OTHER PUBLICATIONS

Sahni et al. ("Electromagnetic Heating Methods for Heavy Oil Reservoirs", 2000, Society of Petroleum Engineers, pp. 1-10).*
Wurmstich et al., "Modeling of Streaming Potential Responses Caused by Oil Well Pumping," GeoScienceWorld, Jan. 1, 1994, 1 page, Abstract only.
Yao et al., "Reservoir Permeability Estimation From Time-Lapse Log Data," Society of Petroleum Engineers, SPE Formation Evaluation, vol. 11, Issue 2, Jun. 1996, 2 pages, Abstract only.
Carcione et al., "An Electromagnetic Modelling Tool for the Detection of Hydrocarbons in the Subsoil," Geophysical Prospecting, 2000, 48, pp. 231-256.
Mailot et al., "Electrical Resistivity Tomography Survey for Delineating Uncharted Mine Galleries in West Bengal, India," Geophysical Prospective 47 (2), Dec. 2001, 2 pages, Abstract only.
Kuras et al., "Fundamentals of the Capacitive Resistivity Technique," British Geological Survey, Nottingham, United Kingdom, Jun. 17, 2005, pp. 1-63.
Schembre et al., "Interrelationship of Temperature and Wettability on the Relative Permeability of Heavy Oil in Diatomaceous Rocks," Society of Petroleum Engineers, SPE Reservoir Evaluation & Engineering, vol. 9, Issue 3, Jun. 2006, 2 pages, Summary only.

Jolley Et All, "Faulting and Fault Sealing in Production Simulation Models: Brent Province, Northern North Sea," Petroleum Geoscience, vol. 13, 2007, pp. 321-340.
Hajibeygi et al., "Iterative Multiscale Finite-Volume Method," Journal of Computational Physics 227, 2008, pp. 8604-8621.
Deng et al., "Simulating the ES-SAGD Process With Solvent Mixture in Athabasca Reservoirs," Society of Petroleum Engineers, Journal of Canadian Petroleum Technology, vol. 49, Issue 1, Jan. 2010, 2 pages, Abstract only.
Sharma et al., "Convection at the Edge of a Steam-Assisted-Gravity-Drainage Steam," Society of Petroleum Engineers, SPE Journal, vol. 16, Issue 3, Sep. 2011, 2 pages, Summary only.
Moinfar et al., "Development of an Efficient Embedded Discrete Fracture Model for 3D Compositional Reservoir Simulation in Fractured Reservoirs," Society of Petroleum Engineers, SPE Journal, vol. 19, Issue 2, Apr. 2014, 2 pages, Summary only.
Hajibeygi et al., "Compositional Multiscale Finite Volume Formulation," SPE Journal 19 (2), Apr. 2014, 2 pages, Abstract only.
Zendehboudi et al., "Dimensional Analysis and Scale-Up of Immiscible Two-Phase Flow Displacement in Fractured Porous Media Under Controlled Gravity Drainage," Energy Fuels, 25 (4), Mar. 25, 2011, 1 page, Abstract only.
Butler, R.M. "Theoretical Studies on the Gravity Drainage of Heavy Oil During In-Situ Steam Heating", Can J. Chern Eng, vol. 59,1981, pp. 1-6.
Butler, R. and Mokrys, 1., "A New Process (VAPEX) for Recovering Heavy Oils Using Hot Water and Hydrocarbon Vapour", Journal of Canadian Petroleum Technology, 30(1 ), 1991, pp. 97-106.
Butler, R. and Mokrys, 1., "Recovery of Heavy Oils Using Vapourized Hydrocarbon Solvents: Further Development of the VAPEX Process", Journal of Canadian Petroleum Technology, 32(6), 1993, pp. 56-62.
Butler, R. and Mokrys, 1., "Closed Loop Extraction Method for the Recovery of Heavy Oils and Bitumens Underlain by Aquifers: the VAPEX Process", Journal of Canadian Petroleum Technology, 37(4), 1998, pp. 41-50.
Das, S.K. and Butler, R.M., "Extraction of Heavy Oil and Bitumen Using Solvents at Reservoir Pressure" CIM 95-118, presented at the CIM 1995 Annual Technical Conference in Calgary, Jun. 1995, pp. 1-16.
Das, S.K. and Butler, R.M., "Diffusion Coefficients of Propane and Butane in Peace River Bitumen" Canadian Journal of Chemical Engineering, 74,988-989, Dec. 1996 pp. 1-8.
Das, S.K. and Butler, R.M., "Mechanism of the Vapour Extraction Process for Heavy Oil and Bitumen", Journal of Petroleum Science and Engineering, 21, 1998, pp. 43-59.
Dunn, S.G., Nenniger, E. and Rajan, R., "A Study of Bitumen Recovery by Gravity Drainage Using Low Temperature Soluble Gas Injection", Canadian Journal of Chemical Engineering, 67, Dec. 1989, pp. 978-991.
Frauenfeld, T., Lillico, D., Jossy, C., Vilcsak, G., Rabeeh, S. and Singh, S., "Evaluation of Partially Miscible Processes for Alberta Heavy Oil Reservoirs", Journal of Canadian Petroleum Technology, 37(4), 1998, pp. 17-24.
Mokrys, 1., and Butler, R., "In Situ Upgrading of Heavy Oils and Bitumen by Propane Deasphalting: The VAPEX 11 Process", SPE 25452, presented at the SPE Production Operations Symposium held in Oklahoma City OK USA, D Mar. 21-23, 1993, pp. 1-16.
Nenniger, J.E. and Dunn, S.G., "How Fast is Solvent Based Gravity Drainage?", CIPC 2008-139, presented at the Canadian International Petroleum Conference, held in Calgary, Alberta Canada, Jun. 17-19, 2008, pp. 1-14.
Nenniger, J.E. and Gunnewick, L., "Dew Point vs. Bubble Point: A Misunderstood Constraint on Gravity Drainage Processes", CIPC 2009-065, presented at the Canadian International Petroleum Conference, held in Calgary, Alberta D Canada, Jun. 16-18, 2009, pp. 1-16.
Bridges, J.E., Sresty, G.C., Spencer, H.L. and Wattenbarger, R.A., "Electromagnetic Stimulation of Heavy Oil Wells", 14, Third International Conference on Heavy Oil Crude and Tar Sands, UNITAR/UNDP, Long Beach D California, USA Jul. 22-31, 1985, pp. 1221-1232.

(56) References Cited

OTHER PUBLICATIONS

Carrizales, M.A., Lake, L.W. and Johns, R.T., "Production Improvement of Heavy Oil Recovery by Using Electromagnetic Heating", SPE115723, presented at the 2008 SPE Annual Technical Conference and Exhibition held in Denver, Colorado, USA, Sep. 21-24, 2008, p. 1.

Carrizales, M. and Lake, L.W., "Two-Dimensional COMSOL Simulation of Heavy-Oil Recovery by Electromagnetic Heating", Proceedings of the COMSOL Conference Boston, 2009, pp. 1-7.

Chakma, A. and Jha, K.N., "Heavy-Oil Recovery from Thin Pay Zones by Electromagnetic Heating", SPE24817, presented at the 67th Annual Technical Conference and Exhibition of the Society of Petroleum Engineers held in Washington, DC, Oct. 4-7, 1992, pp. 1-10.

Chhetri, A.B. and Islam, M.R., "A Critical Review of Electromagnetic Heating for Enhanced Oil Recovery", Petroleum Science and Technology, 26(14), 2008, pp. 1619-1631.

Chute, F.S., Vermeulen, F.E., Cervenan, M.R. and McVea, F.J., "Electrical Properties of Athabasca Oil Sands", Canadian Journal of Earth Science, 16, 1979, pp. 2009-2021.

Davidson, R.J., "Electromagnetic Stimulation of Lloydminster Heavy Oil Reservoirs", Journal of Canadian Petroleum Technology, 34(4), 1995, pp. 15-24.

Hu, Y., Jha, K.N. and Chakma, A., "Heavy-Oil Recovery from Thin Pay Zones by Electromagnetic Heating", Energy Sources, 21(1-2), 1999, pp. 63-73.

Kasevich, R.S., Price, S.L., Faust, D.L. and Fontaine, M.F., "Pilot Testing of a Radio Frequency Heating System for Enhanced Oil Recovery from Diatomaceous Earth", SPE28619, presented at the SPE 69th Annual Technical Conference and Exhibition held in New Orleans LA, USA, Sep. 25-28, 1994, pp. 1-15.

Koolman, M., Huber, N., Diehl, D. and Wacker, B., "Electromagnetic Heating Method to Improve Steam Assisted /N.B./ 23 Gravity Drainage", SPE117481, presented at the 2008 SPE International Thermal Operations and Heavy Oil Symposium held in Calgary, Alberta, Canada, Oct. 20-23, 2008, pp. 1-13.

Kovaleva, L.A., Nasyrov, N.M. and Khaidar, A.M., Mathematical Modelling of High-Frequency Electromagnetic Heating of the Bottom-Hole Area of Horizontal Oil Wells, Journal of Engineering Physics and Thermo Physics, 77(6), 2004, pp. 1184-1191.

McGee, B.C.W. and Donaldson, RD., "Heat Transfer Fundamentals for Electro-thermal Heating of Oil Reservoirs", CIPC 2009-024, presented at the Canadian International Petroleum Conference, held in Calgary, Alberta, Canada, Jun. 16-18, 2009, pp. 1-16.

Ovalles, C., Fonseca, A., Lara, A., Alvarado, V., Urrecheaga, K., Ranson, A. and Mendoza, H., "Opportunities of Downhole Dielectric Heating in Venezuela: Three Case Studies Involving Medium, Heavy and Extra-Heavy Crude Oil Reservoirs" SPE78980, presented at the 2002 SPE International Thermal Operations and Heavy Oil Symposium and International Horizontal Well Technology Conference held in Calgary, Alberta, Canada, Nov. 4-7, 2002, pp. 1-10.

Rice, S.A., Kok, A.L. and Neate, C.J., "A Test of the Electric Heating Process as a Means of Stimulating the 27 Productivity of an Oil Well in the Schoonebeek Field", CIM 92-04 presented at the CIM 1992 Annual Technical Conference in Calgary, Jun. 7-10, 1992, pp. 1-16.

Sahni, A. and Kumar, M. "Electromagnetic Heating Methods for Heavy Oil Reservoirs", SPE62550, presented at the 2000 SPE/AAPG Western Regional Meeting held in Long Beach, California, Jun. 19-23, 2000, pp. 1-10.

Sayakhov, F.L., Kovaleva, L.A. and Nasyrov, N.M., "Special Features of Heat and Mass Exchange in the Face Zone of /N.B./ 29 Boreholes upon Injection of a Solvent with a Simultaneous Electromagnetic Effect", Journal of Engineering Physics and Thermophysics, 71(1), 1998, pp. 161-165.

Spencer, H.L., Bennett, K.A. and Bridges, J.E. "Application of the IITRI/Uentech Electromagnetic Stimulation Process iN.B.i 30 to Canadian Heavy Oil Reservoirs" Paper 42, Fourth International Conference on Heavy Oil Crude and Tar Sands, UNITARIUNDP, Edmonton, Alberta, Canada, Aug. 7-12, 1988, pp. 1-8.

Sresty, G.C., Dev, H., Snow, R.H. and Bridges, J.E., "Recovery of Bitumen from Tar Sand Deposits with the Radio Frequency Process", SPE Reservoir Engineering, Jan. 1986, pp. 85-94.

Vermulen, F. and McGee, B.C.W., "In Situ Electromagnetic Heating for Hydrocarbon Recovery and Environmental Remediation", Journal of Canadian Petroleum Technology, Distinguished Author Series, 39(8), 2000, pp. 25-29.

Schelkunoff, S.K. and Friis, H.T., "Antennas: Theory and Practice", John Wiley & Sons, Inc., London, Chapman Hall, Limited, 1952, pp. 229-244, 351-353.

Gupta, S.C., Gittins, S.D., "Effect of Solvent Sequencing and Other Enhancement on Solvent Aided Process", Journal of Canadian Petroleum Technology, vol. 46, No. 9, Sep. 2007, pp. 57-61.

Deutsch, C.V., McLennan, J.A., "The Steam Assisted Gravity Drainage (SAGD) Process," Guide to SAGD (Steam Assisted Gravity Drainage) Reservoir Characterization Using Geostatistics, Centre for Computational Statistics (CCG), Guidebook Series, 2005, vol. 3; p. 2, section 1.2, published by Centre for Computational Statistics, Edmonton, AB, Canada, pp. 1-14.

Marcuvitz, Nathan, Waveguide Handbook; 1986; Institution of Engineering and Technology, vol. 21 of IEE Electromagnetic Wave series, ISBN 0863410588, Chapter 1, pp. 1-54, published by Peter Peregrinus Ltd. on behalf of The Institution of Electrical Engineers, © 1986, pp. 1-57.

Marcuvitz, Nathan, Waveguide Handbook; 1986; Institution of Engineering and Technology, vol. 21 of IEE Electromagnetic Wave series, ISBN 0863410588, Chapter 2.3, pp. 66-72, published by Peter Peregrinus Ltd. on behalf of The Institution of Electrical Engineers, © 1986. pp. 1-10.

Carlson et al., "Development of the IIT Research Institute RF Heating Process for In Situ Oil Shale/Tar Sand Fuel Extraction—An Overview", Apr. 1981, pp. 1-9.

A. Godio: "Open ended-coaxial Cable Measurements of Saturated Sandy Soils", American Journal of Environmental Sciences, vol. 3, No. 3, 2007, XP002583544, pp. 175-182.

"Control of Hazardous Air Pollutants From Mobile Sources", U.S. Environmental Protection Agency, Mar. 29, 2006. p. 15853 (http://www.epa.gov/EPA-AIR/2006/March/Day-29/a2315b.htm), pp. 1-13.

Von Hippel, Arthur R., Dielectrics and Waves, Copyright 1954, Library of Congress Catalog Card No. 54-11020, Contents, pp. xi-xii; Chapter II, Section 17, "Polyatomic Molecules", Appendix C-E, New York, John Wiley and Sons, pp. 150-155, pp. 273-277.

"Technologies for Enhanced Energy Recovery" Executive Summary, Radio Frequency Dielectric Heating Technologies for Conventional and Non-Conventional Hydrocarbon-Bearing Formulations, Quasar Energy, LLC, Sep. 3, 2009, pp. 1-6.

Burnhan, "Slow Radio-Frequency Processing of Large Oil Shale Volumes to Produce Petroleum-like Shale Oil," U.S. Department of Energy, Lawrence Livermore National Laboratory, Aug. 20, 2003, UCRL-ID-155045, pp. 1-17.

Sahni et al., "Electromagnetic Heating Methods for Heavy Oil Reservoirs," U.S. Department of Energy, Lawrence Livermore National Laboratory, May 1, 2000, UCL-JC-138802, pp. 1-10.

Abernethy, "Production Increase of Heavy Oils by Electromagnetic Heating," The Journal of Canadian Petroleum Technology, Jul.-Sep. 1976, pp. 91-97.

Sweeney, et al., "Study of Dielectric Properties of Dry and Saturated Green River Oil Shale," Lawrence Livermore National Laboratory, Mar. 26, 2007, revised manuscript Jun. 29, 2007, published on Web Aug. 25, 2007, pp. 1-9.

Kinzer, "Past, Present, and Pending Intellectual Property for Electromagnetic Heating of Oil Shale," Quasar Energy LLC, 28th Oil Shale Symposium Colorado School of Mines, Oct. 13-15, 2008, pp. 1-18.

Kinzer, "Past, Present, and Pending Intellectual Property for Electromagnetic Heating of Oil Shale," Quasar Energy LLC, 28th Oil Shale Symposium Colorado School of Mines, Oct. 13-15, 2008, pp. 1-33.

Kinzer, A Review of Notable Intellectual Property for In Situ Electromagnetic Heating of Oil Shale, Quasar Energy LLC, p. 1.

(56) References Cited

OTHER PUBLICATIONS

"Oil sands." Wikipedia, the free encyclopedia. Retrieved from the Internet from: http://en.wikipedia.org/w/index.php? title=Oil_sands &printable=yes, Feb. 16, 2009, pp. 1-14.
Sahni et al., "Electromagnetic Heating Methods for Heavy Oil Reservoirs." 2000 Society of Petroleum Engineers SPE/AAPG Western Regional Meeting, Jun. 19-23, 2000, pp. 1-12.
Power et al., "Froth Treatment: Past, Present & Future." Oil Sands Symposium, University of Alberta, May 3-5, 2004, pp. 1-29.
Flint, "Bitumen Recovery Technology a Review of Long Term R&D Opportunities." Jan. 31, 2005. LENEF Consulting (1994) Limited, Part 1, 100 pgs; Part 2, 110 pgs.
"Froth Flotation." Wikipedia, the free encyclopedia. Retrieved from the internet from: http://en.wikipedia.org/wiki/ Froth_flotation, Apr. 7, 2009, pp. 1-6.
"Relative static permittivity." Wikipedia, the free encyclopedia. Retrieved from the Internet from http://en.wikipedia.org/ w/index/ php?title=Relative_static_permittivity&printable=yes, Feb. 12, 2009, pp. 1-3.
"Tailings." Wikipedia, the free encyclopedia. Retrieved from the Internet from http://en.wikipedia.org/w/index.php? title=Tailings &printable=yes, Feb. 12, 2009, pp. 1-6.
United States Patent and Trademark Office, Non-final Office action issued in U.S. Appl. No. 12/396,247, dated Mar. 28, 2011, pp. 1-10.
United States Patent and Trademark Office, Non-final Office action issued in U.S. Appl. No. 12/396,284, dated Apr. 26, 2011, pp. 1-62.
Patent Cooperation Treaty, Notification of Transmittal of the International Search Report and The Written Opinion of the International Searching Authority, or the Declaration, in PCT/US2010/025808, dated Apr. 5, 2011, pp. 1-12.
PCT International Search Report and Written Opinion in PCT/US2010/025765, dated Jun. 30, 2010, pp. 1-11.
PCT International Search Report and Written Opinion in PCT/US2010/025772, dated Aug. 9, 2010, pp. 1-16.
PCT International Search Report and Written Opinion in PCT/US2010/025763, dated Jun. 4, 2010, pp. 1-15.
PCT International Search Report and Written Opinion in PCT/US2010/025807, dated Jun. 17, 2010, pp. 1-15.
PCT International Search Report and Written Opinion in PCT/US2010/025804, dated Jun. 30, 2010, pp. 1-15.
PCT International Search Report and Written Opinion in PCT/US2010/025769, dated Jun. 10, 2010, pp. 1-15.
PCT Notification of Transmittal of the International Search Report and The Written Opinion of the International Searching Authority, or the Declaration, in PCT/US2010/025761, dated Feb. 9, 2011, pp. 1-13.
PCT Notification of Transmittal of the International Search Report and The Written Opinion of the International Searching Authority, or the Declaration, in PCT/US2010/057090, dated Mar. 3, 2011, pp. 1-10.

\* cited by examiner

| FREQ (kHz) | INDEX | A | B | C |
|---|---|---|---|---|
| 0.1 | 0 | 11 | 0 | 730 |
| 10 | 1 | 11 | 1 | 6.9 |
| 1000 | 2 | 10 | 1.7 | 0 |
| 10000 | 3 | 3.7 | 1.6 | 0 |
| 100000 | 4 | 3.3 | 1 | 0 |
| 1000000 | 5 | 3.3 | 0.82 | 0 |

OPERATION IS GENERALLY LIMITED TO THIS ZONE WITH LOGARITHMIC INTERPOLATION USED TO PROVIDE MORE ACCURATE VALUES FOR THE CONSTANTS

*FIG. 10*

CONTROL SYSTEM FOR EXTRACTION OF HYDROCARBONS FROM UNDERGROUND DEPOSITS

STATEMENT REGARDING FEDERALLY SPONSORED RESEARCH OR DEVELOPMENT

[Not Applicable]

BACKGROUND OF THE INVENTION

As the world's standard crude oil reserves are exhausted, and the continued demand for oil causes oil prices to rise, oil producers are trying to increase their output of hydrocarbons from bituminous ore, oil sands, tar sands, and heavy oil deposits. These materials are often found in naturally occurring mixtures of sand or clay. Because of the high viscosity of bituminous ore, oil sands, oil shale, tar sands, and heavy oil, the drilling and refinement methods used in extracting standard crude oil are typically not available. Therefore, recovery of oil from these deposits requires heating to separate hydrocarbons from other geological materials and to preserve hydrocarbons at temperatures at which they will flow. Steam is typically used to provide this heat, although electric and radio frequency heating is sometimes employed. The heating and processing can take place in-situ, or in another location after strip mining the deposits.

During in-situ processing, it is difficult to sense the real-time conditions in the deposit and the well bore. Uncertainty often exists about whether the hydrocarbons are indeed flowing. Valuable time and heat energy are wasted in unsuccessful attempts at in-situ processing when low formation permeability conditions prevent diffusion of steam and limit heating, or when steam and heat move away from a zone that is targeted for heating through formation fractures or through high permeability materials.

"Well logging" may be used to check and record subsurface conditions. Such well logging involves an examination of core samples, and moving sensors up or down the well bores. Sensors are used to measure, for example, electrical resistance, acoustic properties, natural radioactivity, density of the formation surrounding the well, and the like. However, these measurements do not produce a near real-time picture of conditions in the formation. They produce only a static and partial picture of such conditions.

SUMMARY OF THE INVENTION

A control system for use in extracting hydrocarbons from an underground deposit is disclosed that comprises an electromagnetic heating system and a processor. The electromagnetic heating system is configured to heat the underground deposit to facilitate fluid flow of a resource for extraction from the underground deposit. The processor is configured to control the electromagnetic heating system in response to temperature data and pressure data for the underground deposit. The processor correlates the temperature data and pressure data with predetermined water phase characteristics to control the electromagnetic heating system so that substantially all water in the underground deposit is maintained in a liquid state. The control system may also generate voxel data corresponding to spatial characteristics of the underground deposit. The spatial characteristics may be presented to a user as a map on a display.

Other aspects of the invention will be apparent from this disclosure.

BRIEF DESCRIPTION OF THE DRAWINGS

FIG. 10 is a table of coefficients that may be used to generate dielectric voxels at various operating frequencies of the electromagnetic heating system.

DETAILED DESCRIPTION OF THE PREFERRED EMBODIMENTS

Figure 1:
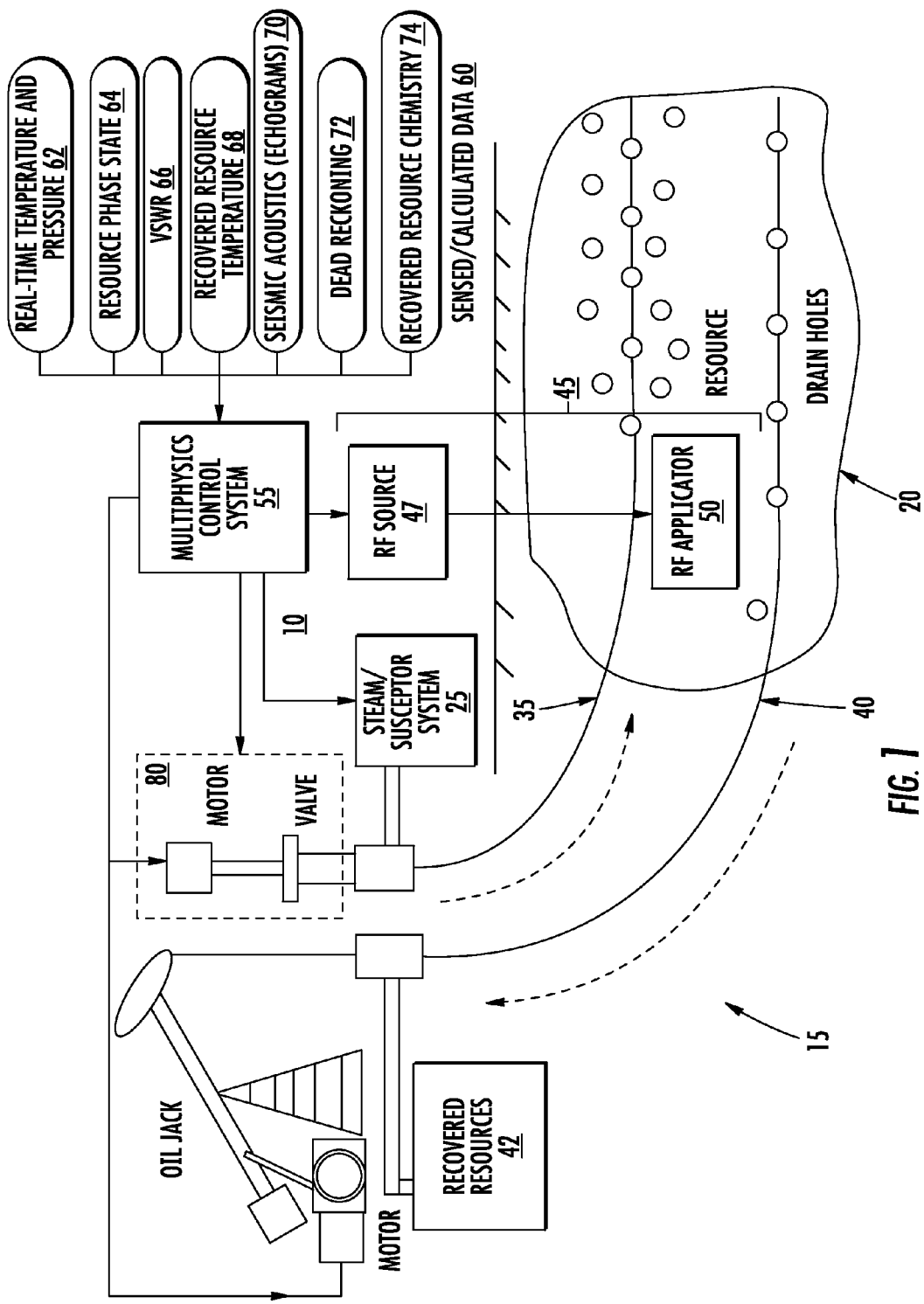
FIG. 1 shows one embodiment of a steam assisted gravity drainage system for in-situ extraction of hydrocarbons from an underground resource, where the extraction system includes a control system.

FIG. 1 illustrates one embodiment of a steam assisted gravity drainage system 15 for in-situ extraction of hydrocarbons from an underground deposit 20. As shown, steam assisted gravity drainage system 15 includes a control system 10 that controls the operation of the various components of the system. Steam and other suitable susceptors for the steam assisted gravity drainage system 15 are provided by a steam and susceptor system 25. The steam and susceptors are injected from the steam and susceptor system 25 through a delivery pipe 35 and into the underground deposit 20. The steam and susceptor heat the materials in the underground deposit 20 to a temperature at which hydrocarbons in the formation, condensed steam, and possibly other liquids drain down to a recovery pipe 40 where they are pumped out as recovered resources into storage tanks 42 for storage and processing. Although control system 10 is described in the context of the steam assisted gravity drainage system 15, it may be employed in any type of hydrocarbon extraction system.

Electromagnetic energy may be used along with the heated mixture of steam and susceptor to augment the heating of the underground deposit 20. To this end, steam assisted gravity drainage system 15 includes an electromagnetic heating system 45 that provides electromagnetic energy to underground deposit 20. Electromagnetic energy is provided from an RF source 47 to an antenna 50. Electric and magnetic fields are generated at antenna 50 to heat the materials in underground deposit 20. Magnetic fields generated at antenna 50 heat materials in underground deposit 20 that exhibit magnetic dissipation while conductive materials are heated by eddy currents that can be induced by both magnetic and electric fields. Such materials are efficiently heated by RF energy when the strongest fields generated at antenna 50 are matched with the materials in underground deposit 20. For example, conductive materials such as water and, particularly, water mixed with sodium hydroxide, are efficiently heated by eddy current produced by a magnetic field at the antenna 50. Materials that are not electrically conductive but that exhibit dielectric dissipation are effectively heated at antenna 50 by RF electric fields.

Mixtures of materials (e.g., steam and susceptors) that are susceptible to electromagnetic heating may be injected through delivery pipe 35 and into underground deposit 20 from the surface. The resulting heated mixture, including the hydrocarbons, are all electromagnetic the heated to a point at which they are liquefied and pumped from underground deposit 20 through recovery pipe 40. Copending applications assigned to Harris having docket numbers 20478US01 and 20483US01 disclose heating of hydrocarbons by mixing hydrocarbons with materials that are strongly susceptible to electromagnetic heating. Both applications are included herein by reference.

Various facets of the steam assisted gravity drainage system 15 may be controlled by the multiphysics control system 55 using sensed/calculated data 60. The sensed/calculated data 60 may include, for example, real-time temperature and pressure data 62, resource phase state data 64, voltage standing wave ratio (VSWR) values 66, recovered resource temperature data 68, seismic acoustic data 70, dead reckoning data 72, and recovered resource chemistry data 74.

The sensed/calculated data 60 represents various characteristics of the underground deposit 20. More particularly, the resource phase state data 64 may be used to determine whether the water and/or other resources in the underground deposit 20 are in gas or liquid states. The VSWR values 66 provide an indication of the extent to which the output impedance of electromagnetic heating system 45 matches the input impedance of the antenna 50 and the underground deposit 20. Minimizing the VSWR values 66 ensures proper power transfer from the electromagnetic heating system 45 to the underground deposit 20. The VSWR values 66 may be determined from pulse reflectometry. The recovered resource temperature data 68 correspond to the temperature of the resources in the underground deposit 20. The seismic acoustic data 70 correspond to data obtained from, for example, echograms of the underground deposit 20. The dead reckoning data 72 corresponds to such things as water injected to date, watts used to date, and similar consumption of materials and energy used for the extraction of the resource from the underground deposit 20. The recovered resource chemistry data 74 may include data such as the molecular weight, water-to-oil ratio, recovered resource water phase, and other characteristics of the underground deposit Among other things, the multiphysics control system 55 uses the sensed/calculated data 60 to control provision of electromagnetic energy, steam, and susceptor to the underground deposit 20. In the system shown in FIG. 1, multiphysics control system 55 controls the temperature and composition of the steam and susceptor components of susceptor system 25 as well as the amount of the steam and susceptor provided through delivery pipe 35 to underground deposit 20. The steam and susceptor provided through delivery pipe 35 may be controlled, at least in part, through manipulation of the elements of the motor and valve system 80. The multiphysics control system 55 may also use the sensed/calculated data 60 to control parameters of the RF energy provided from electromagnetic heating system 45 to the underground deposit 20. As will be explained in further detail below, multiphysics control system 55 controls the parameters of the applied RF energy based, at least in part, on the phase of the water in the underground deposit 20. The water phase may be determined using one or more of the sensed/calculated data 60.

Figure 2:
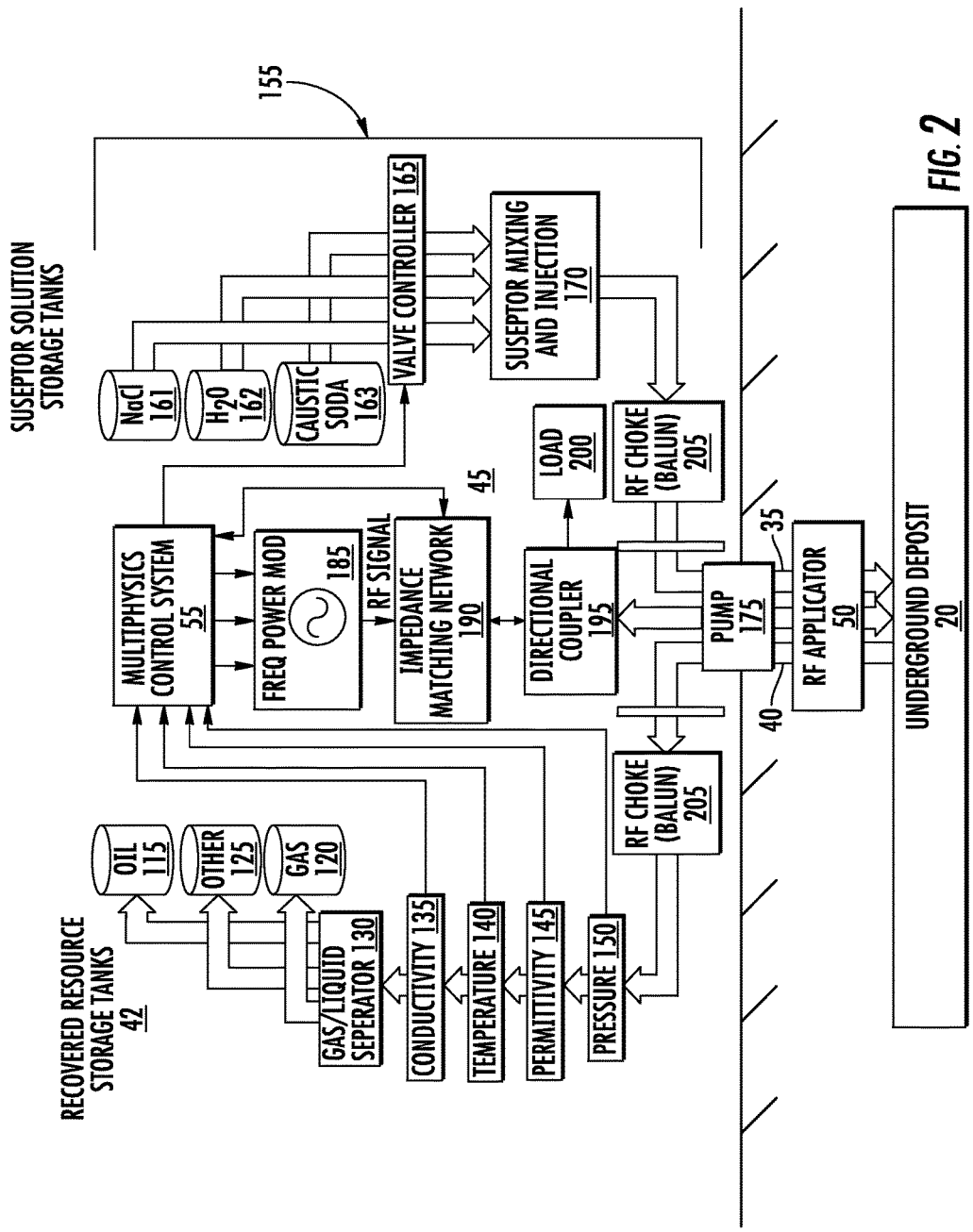
FIG. 2 is a block diagram of an embodiment of the system shown in FIG. 1.

FIG. 2 is a diagram of a further embodiment of steam assisted gravity drainage system 15. In this embodiment, the steam assisted gravity drainage system 15 employs a multiphysics control system 55 that receives data representing the characteristics of the underground deposit 20 and uses that data to control operation of the various components of the system 15. Some of this data may be obtained from an analysis of extracted resources stored in storage tanks 42. Such recovered resources are extracted through recovery pipe 40 and passed through a gas and liquid separator 130 before being provided to the storage tanks 42. The storage tanks 42 may include an oil storage tank 115, a gas storage tank 120, and a further storage tank 125, where storage tank 125 may be used to store miscellaneous constituents of the recovered resource. The extracted resource analysis may be executed, for example, as an off-line process.

The data used by the multiphysics control system 55 is not limited to data obtained by the extracted resource analysis. Rather, data may also be obtained on a substantially real-time basis from sensors placed at strategic locations in steam assisted gravity drainage system 15 (see in-situ sensor network 310 of FIG. 3). Such data may include, for example, real-time temperature and pressure measurements of the underground deposit 20.

The characteristics of underground deposit 20 provided to multiphysics control system 55 in FIG. 2 include the conductivity 135 of the resources in underground deposit 20, the temperature 140 of the resources and underground deposit 20, the permeability 145 of the resources in of underground deposit 20, and the pressure 150 in underground deposit 20. The multiphysics control system 55 uses this data to exercise control over the elements of steam assisted gravity drainage system 15 that apply electromagnetic energy, steam, and susceptor to underground deposit 20. One of the goals of such control is to increase the efficiency of the energy transfer from the system 15 to the underground deposit 20. This may be accomplished, for example, by controlling the parameters of the RF power applied to underground deposit 20 as well as controlling the composition and injection of the steam and susceptor to underground deposit 20.

As shown in FIG. 2, the system 15 provides steam and susceptor to the underground deposit 20 using a fluid supply system 155. The fluid supply system 155 may employ storage tanks 160 including, for example, a sodium chloride supply tank 161, a water supply tank 162, and a caustic soda supply tank 163. The multiphysics control system 55 manipulates the composition of the mixture provided to underground deposit 20 by regulating the flow of liquid provided from the storage tanks 160 to a susceptor mixing and injection system 170. In this example, multiphysics control system 55 may regulate this flow by providing the appropriate control signals to a valve controller 165 disposed between the storage tanks 160 and the susceptor mixing and injection system 170. The multiphysics control system 55 operates the valve controller 165 based on conductivity 135, temperature 140, permeability 145, and/or pressure 150 to provide a mixture having the desired composition. Once the desired mixture is obtained, it is provided to the susceptor mixing and injection system 170 and, therefrom to delivery pipe 35 through fluid pump 175.

Electromagnetic energy is provided to the underground deposit 20 using the electromagnetic heating system 45 to heat the resources in the underground deposit 20. In the embodiment shown in FIG. 2, the electromagnetic heating system 45 includes an RF signal generator 185 having its frequency, power, and waveform modulation controlled by the multiphysics control system 55. The RF signal from electromagnetic heating system 45 is coupled to the input of an impedance matching network 190, which is used by the multiphysics control system 55 to calculate the VSWR values 66. The multiphysics control system 55 controls the impedance matching network 190 to minimize the VSWR values 66 thereby maximizing power transfer between the RF signal generator 185, antenna 50, and underground deposit 20. As shown in FIG. 2, the output of the impedance matching network 190 may be provided to the input of a directional coupler 195 having a first terminal coupled to a load 200 and a second terminal coupled to the antenna 50. The electromagnetic heating system 45 may also include RF chokes 205 that are positioned to prevent undesired electromagnetic energy leakage from the electromagnetic heating system 45 to other portions of the system 15.

The multiphysics control system 55 is configured to control electromagnetic heating system 45 in response to the temperature and pressure of the underground deposit 20. Referring to FIG. 1, the temperature and pressure data 62 may include real-time temperature and pressure measurements obtained from sensors positioned at strategic locations in system 15 and/or temperature and pressure data 62 derived through the extracted resource analysis.

The sensed temperature and pressure of the well 340 is correlated by the multiphysics control system 55 with predetermined water phase characteristics to control the operation of the electromagnetic heating system 45 so that substantially all water in the underground deposit 20 is maintained in a liquid state. N one example, multiphysics control system 55 is configured to use sensed temperature measurements and sensed pressure measurements in conjunction with Mollier water phase temperature and pressure data to determine the phase of the water in underground deposit 20. The multiphysics control system 55 may use this water phase determination to provide signals to electromagnetic heating system 45 that control waveform parameters such as frequency, modulation, and power. Further, if attempts to maintain the water in a liquid phase using the waveform parameters are unsuccessful, electromagnetic heating system 45 may be disconnected so that it no longer provides any electromagnetic energy to the underground deposit 20.

The multiphysics control system 55 may further correlate the temperature and pressure characteristics of underground deposit 20 with its permittivity and conductivity characteristics. For example, the temperature and pressure measurements may be correlated with Mollier data, which, in turn, may be used to determine the permittivity and conductivity of resources in underground deposit 20. The multiphysics control system 55 may use the permittivity and conductivity measurements obtained in this manner as alternative or additional data that, in turn, may be used to control the electrical parameters of the electromagnetic heating system 45.

Figure 3:
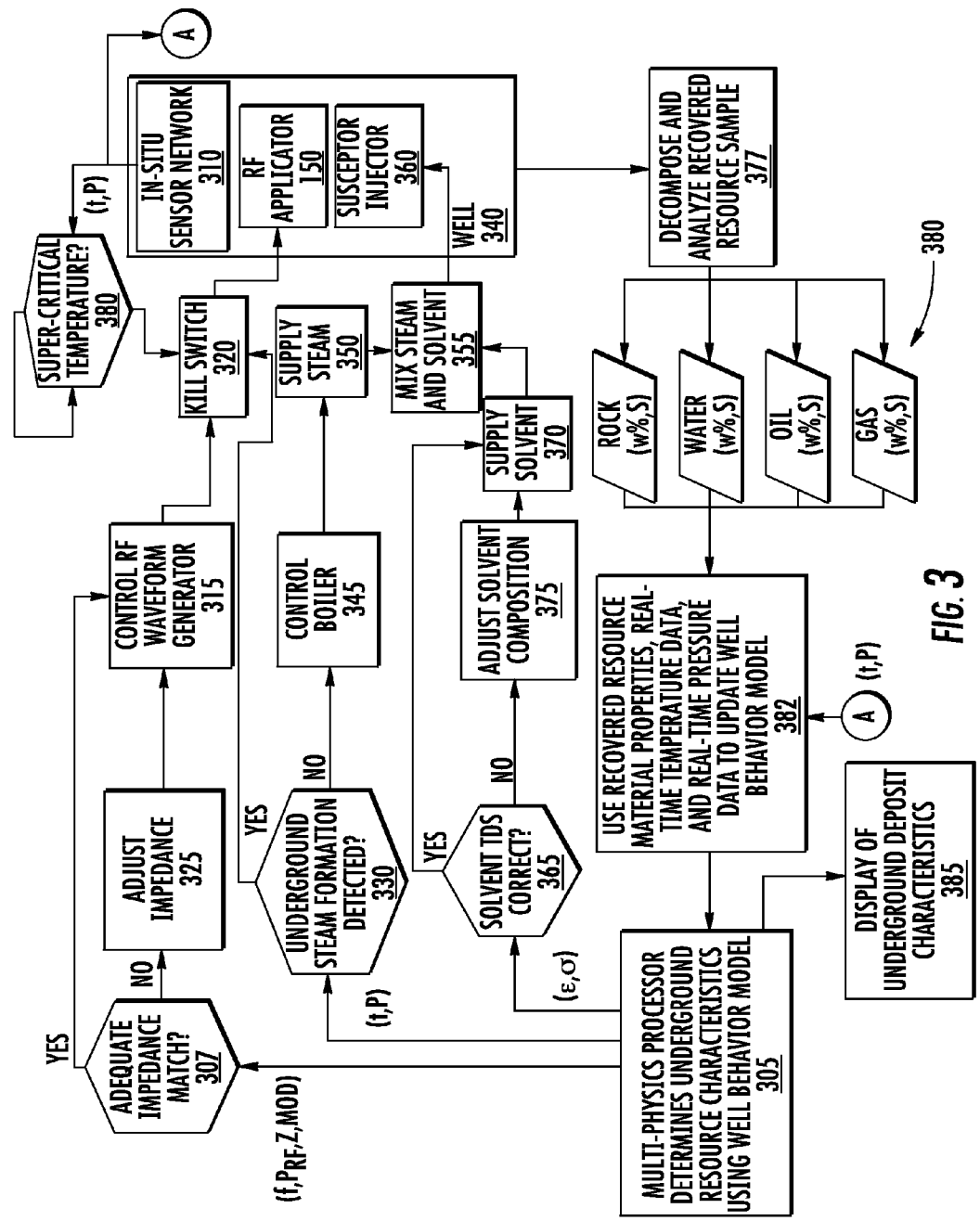
FIG. 3 is a block diagram of elements and operations included in and executed by the system shown in FIG. 2.

FIG. 3 is a block diagram of elements and operations included in and executed by the system shown in FIG. 2. In this example, various components of system 15 provide input data to multiphysics control system 55, which, in turn, is used to generate output control signals. Among the output control signals are those that are used to apply electromagnetic energy, steam, and susceptor to the underground deposit 20.

The multiphysics control system 55 may begin its control operations using an a priori model of system 15 and underground deposit 20. The a priori model may be generated using well logging information obtained before the well 340 is drilled. Such well logging information may include electrical resistance maps, alpha particle backscatter information, and the like.

At operation 305, multiphysics control system 55 derives well characteristics using the well behavior model. The initial a priori well behavior model may include values for the RF power and frequency of electromagnetic heating system 45, steam pressure, and resource spatial distribution. These values may be derived from well logging and other pre-drilling information. Further, the a priori model may be used as a means to provide initial temperature and pressure values for underground deposit 20. Still further, the a priori model may be used as a means to provide initial bulk permittivity ($\varepsilon$) and bulk conductivity ($\sigma$) of underground deposit 20.

As the well 340 is used over time, new well data becomes available to multiphysics control system 55. This new well data, in turn, is used to update the a priori model to a more accurate working well behavior model. The updated data may include resource properties obtained during a recovered resource analysis. Additionally, or in the alternative, the well behavior model may be updated using real-time sensed well parameters obtained from an in-situ sensor network 310. The well behavior model may be updated at predetermined intervals or whenever an updated version of the well behavior model is desired.

The frequency, power, modulation, and impedance parameters are used by multiphysics control system 55 at operation 307 to determine whether there is an adequate impedance match between the electromagnetic heating system 45 and underground deposit 20. Time domain reflectrometry may be used in this determination. To this end, the impedance matching network 190 may include a time domain reflectometer that is connected to delivery pipe 35 and recovery pipe 40 through directional coupler 195. Delivery pipe 35 and recovery pipe 40 may serve as antennas for the time domain reflectometer and form a transmission line of the "open wire" type. During the extraction process, the RF signal generator 185 may transmit a short rise time RF pulse to delivery pipe 35. The characteristics of the reflected pulse are a function of the impedance encountered by the pulse and may be used to determine the VSWR values.

The multiphysics control system 55 performs different operations depending on whether the impedance match is satisfactory. If it is satisfactory, the multiphysics control system 55 controls RF signal generator 185 at operation 315 to provide electromagnetic power through kill switch 320 for ultimate provision to underground deposit 20. Some of the electrical parameters that may be used at operation 315 to control RF signal generator 185 include waveform frequency (f), power ($P_{RF}$), modulation frequency and type, and, as noted above, impedance (Z). However, when the impedance match is inadequate, multiphysics control system 55 adjusts the impedance of the impedance matching network 190 at operation 325 to minimize the VSWR thereby maximizing power transfer to the underground deposit 20 and.

The multiphysics control system 55 decides at operation 330 whether steam has formed in underground deposit 20. To this end, multiphysics control system 55 may receive real-time temperature (t) and pressure (P) data from in-situ sensor network 310 and correlate this data with, for example, Mollier water phase data. If steam is detected, multiphysics control system 55 may adjust the parameters of electromagnetic heating system 45 at operation 315 to prevent further steam generation in underground deposit 20. Alternatively, multiphysics control system 55 may operate kill switch 320 to effectively disconnect electromagnetic heating system 45 from underground deposit 20 to prevent further application of electromagnetic energy.

If steam is not detected, multiphysics control system 55 controls the boiler at operation 345. Steam from the boiler is provided to a boiler steam supply at operation 350. The steam and solvent are mixed at operation 355 before being injected into underground deposit 20 at operation 360.

The multiphysics control system 55 may also control the composition of the solvent that is mixed with the steam at operation 355. At operation 365, multiphysics control system 55 uses the dielectric permittivity ($\varepsilon$) and the conductivity ($\sigma$) of underground deposit 20 to decide whether the total dissolved solvents (TDS) of the solvent mix have the desired composition. The dielectric permittivity ($\varepsilon$) and the conductivity ($\sigma$) values may be obtained by correlating the sensed temperature data (t) and sensed pressure data (P) with, for example, water phase data. The water phase data may be obtained using, for example, water phase data derived from a Mollier water phase chart.

If the solvent TDS composition is correct, multiphysics control system 55 provides the solvent at operation 370 for mixing at operation 355. However, if the TDS does not have the correct composition, the multiphysics control system 55 adjusts the composition at operation 375 before execution of operation 370.

Figure 4:
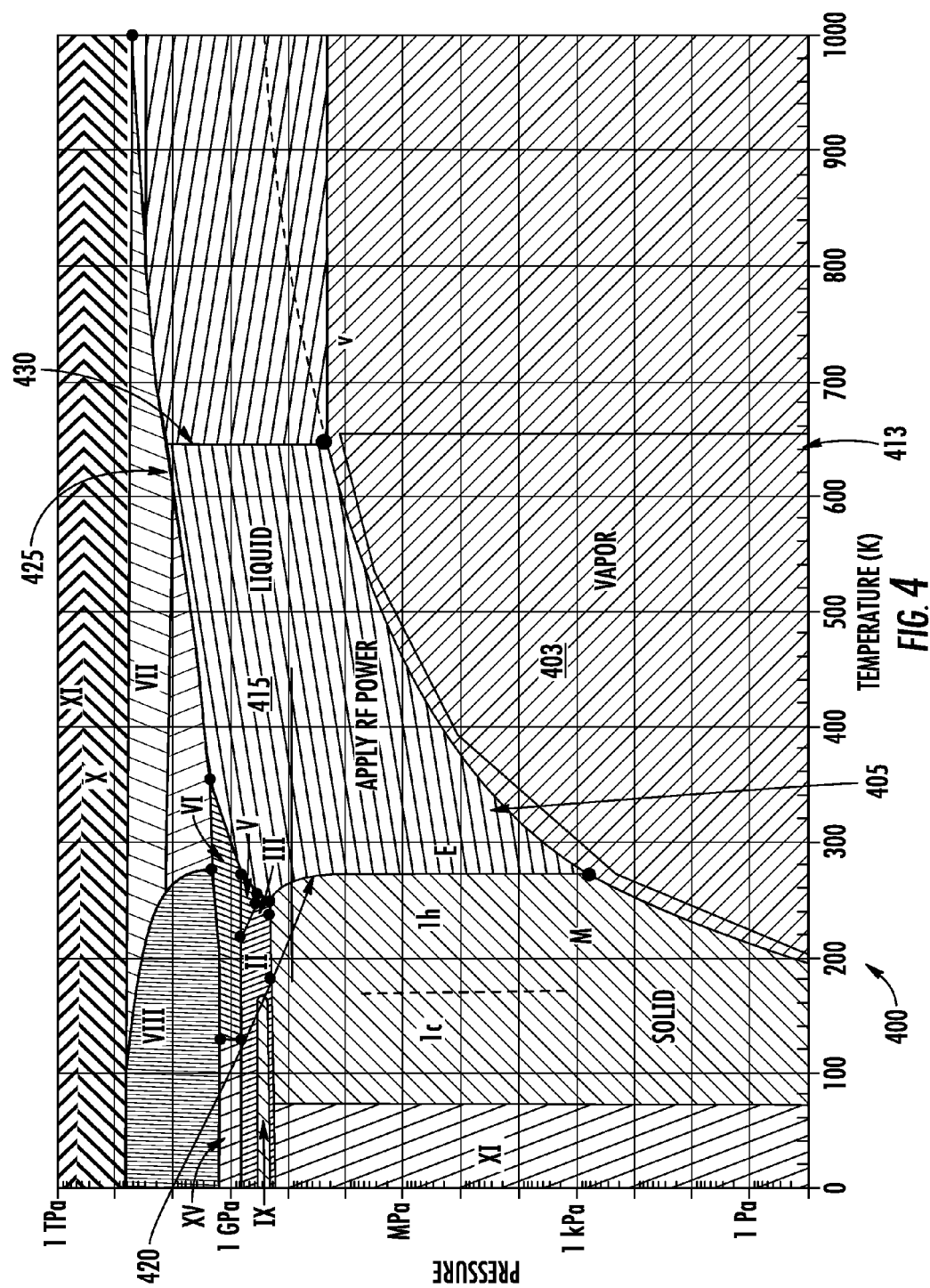
FIGS. 4 and 5 are Mollier charts showing temperature on the x-axis and pressure on the y-axis for different water phases.

FIG. 4 is a Mollier chart 400 showing temperature on the x-axis and pressure on the y-axis for different water phases. As shown, water is in a vapor (steam) phase in the region 403 of Mollier chart 400. Region 403 is defined by phase boundaries 405, 410, and 413. Water is in a liquid phase in region 415 of Mollier chart 400. Region 415 is defined by phase boundaries 405, 420, 425, and 430.

As shown in FIG. 3, the sensed temperature and pressure data provided by the in-situ sensor network 310 is used to determine whether the underground deposit 20 and/or well 340 is operating in region 415 of Mollier chart 400. The multiphysics control system 55 controls the electromagnetic heating system 45 to drive the well 340 and/or underground deposit 20 to an optimized portion of region 415. However, if the sensed temperature and pressure data indicate that the well 340 and/or underground deposit 20 is operating in region 403, multiphysics control system 55 executes operation 330 so that kill switch 320 effectively open circuits electromagnetic heating system 45 thereby preventing provision of further electromagnetic energy to the underground deposit 20. The multiphysics control system 55 may also open circuit kill switch 320 at operation 380 when the data provided by in-situ sensor network 310 indicates that the well 340 and/or underground deposit 20 is operating at a super-critical temperature. Although FIG. 3 shows the kill switch 320 used in connection with the application and removal of RF power to underground deposit 20, the system 15 may include other kill switches that, for example, prevent injection of the steam and solvent mix dependent on whether or not predetermined conditions are met. Further, the system 15 may use other manners of controllably applying and removing RF power to the underground deposit 20.

Figure 5:
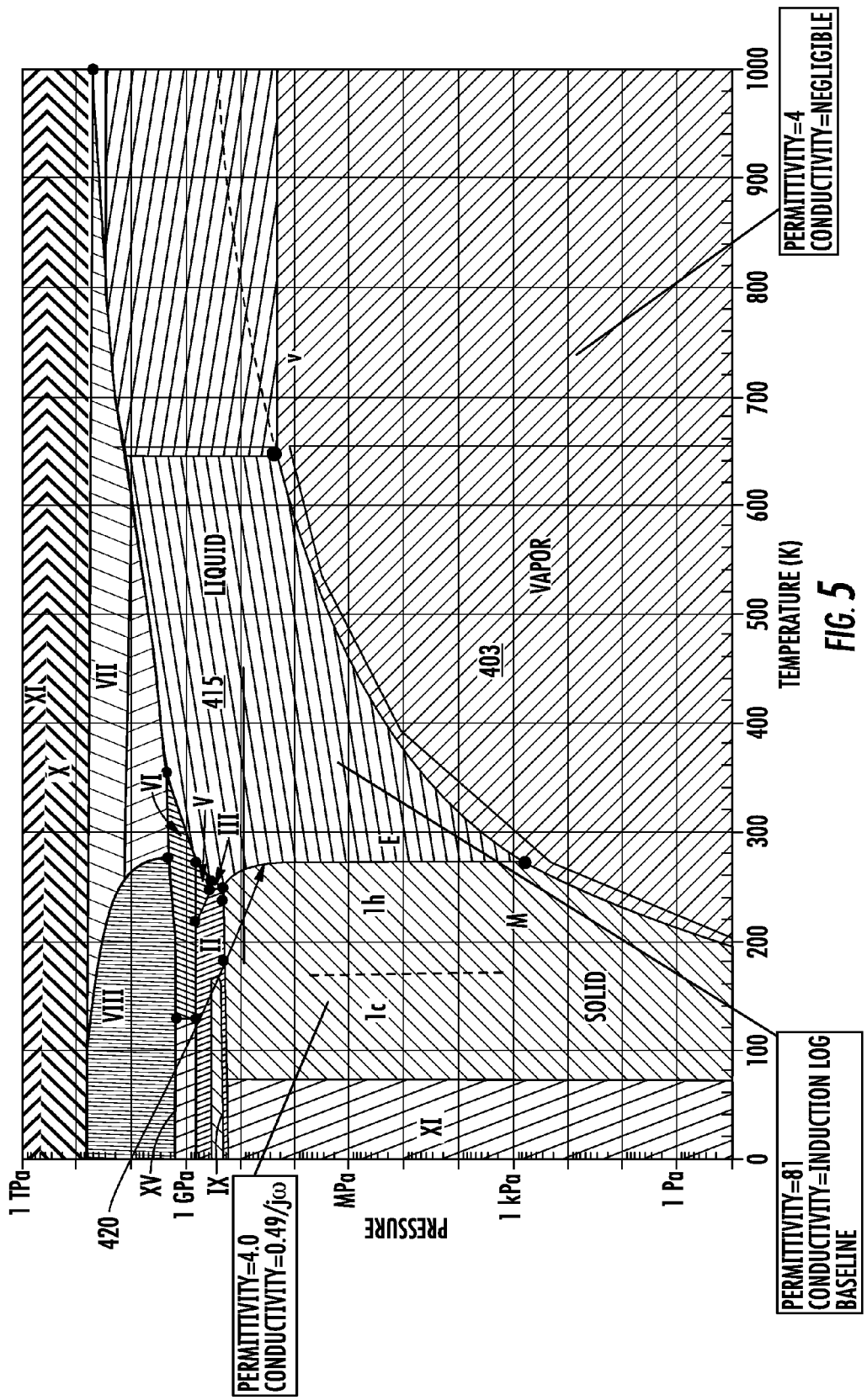

FIG. 5 is also a Mollier chart 500 showing temperature on the x-axis and pressure on the y-axis for different water phases. In this instance, however, the temperature data and pressure data of the Mollier chart 500 is correlated with the permittivity ($\varepsilon$) and conductivity ($\sigma$) of underground deposit 20. As shown, the permittivity ($\varepsilon$) of underground deposit 20 when system 15 is operated in the central portion of region 415 is approximately 81 F/m as determined from the Mollier data. This value varies depending on the portion of region 415 in which the system 15 is operating. The conductivity ($\sigma$) of underground deposit 20 likewise depends on the portion of region 415 in which the system 15 is operating. As shown, the conductivity ($\sigma$) of underground deposit 20 when system 15 is operated in region 415 corresponds to an induction log baseline that is determined from the Mollier data.

The well behavior model may be updated to more accurately reflect the characteristics of underground deposit 20 over time. Updates may be based on resource samples recovered from underground deposit 20 and decomposed at operation 377. Operation 377 may be executed as an online or off-line process. The decomposed materials may be separately analyzed at operation 380 and categorized, for example, as rock, water, oil, and gas. The weight percentage w % and/or the bulk volume percentage s % of each material is used at operation 382 to update the well behavior model. Additionally, or in the alternative, the sensed temperature (t) and the sensed pressure (p) from the in-situ sensor network 310 may be used at operation 382 to update the well behavior model. The updated well behavior model is employed at operation 305 to update the control parameters used to operate system 15. Still further, the updated well behavior model may be used at operation 385 to generate a substantially real-time display of the characteristics of underground deposit 20.

Figure 6:
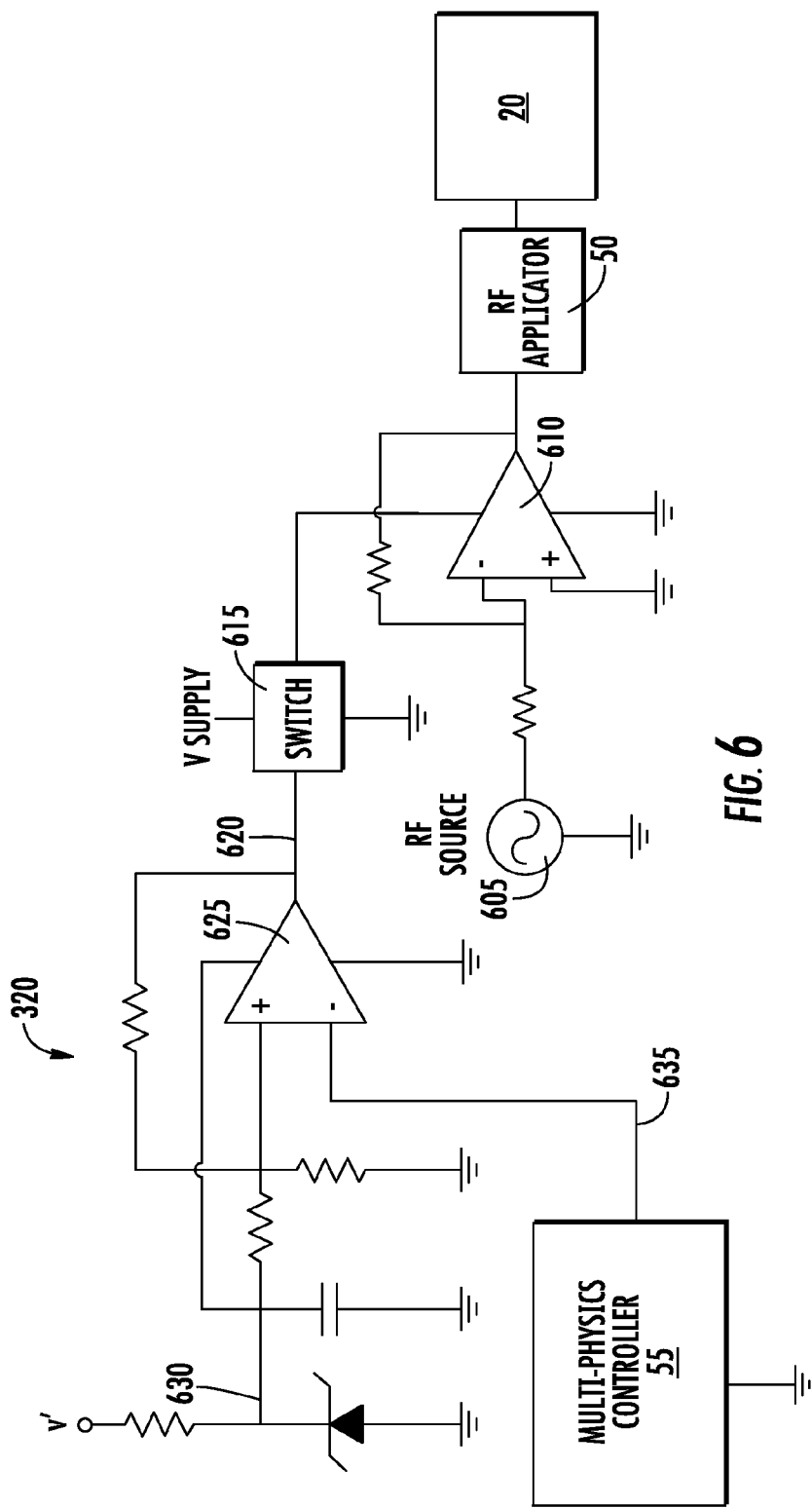
FIG. 6 shows one embodiment of a kill switch.

FIG. 6 shows one embodiment of the kill switch 320. In this embodiment, an electromagnetic signal is provided from an RF source 605 to an input of an RF driver 610. The output of RF driver 610 is provided to pressure 150 which, in turn, provides electromagnetic energy to underground deposit 20. The RF driver 610 receives its power through a power switch 615. The power switch 615 is either activated or deactivated based on the level of a switch control signal 620, which is provided at the output of a comparator 625. A reference signal 630 is provided to a first input of comparator 625 and a kill condition signal 635 is provided to a second input of the comparator 625.

When multiphysics control system 55 detects a condition in which the supply of RF power to underground deposit 20 is to cease, it directs the kill condition signal 635 to a predetermined signal level. The comparator 625 compares the reference signal 630 with the kill condition signal 635 to direct power switch 615 to an active level. When this occurs, power switch 615 drives RF driver 610 to a state in which power is removed from RF driver 610. In this state, the electromagnetic energy from RF source 605 is no longer provided to antenna 50.

Figure 7:
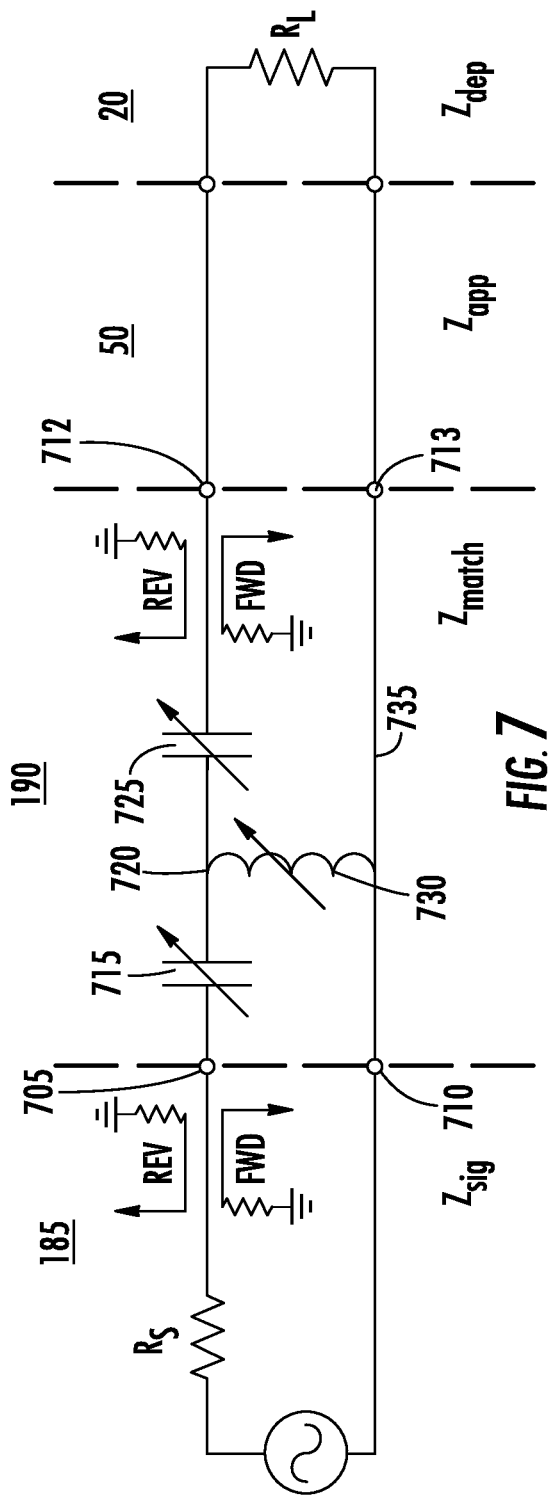
FIG. 7 illustrates the impedance encountered at various portions of the embodiment of the system shown in FIG. 2.

FIG. 7 illustrates the impedance encountered at various portions of system 15. As shown, the RF signal generator 185 has an impedance $Z_{sig}$, the antenna 50 has an impedance $Z_{app}$, and the underground deposit 20 has an impedance $Z_{dep}$. The impedance matching network 190 has an impedance $Z_{match}$ and is disposed between RF signal generator 185 and antenna 50 with the objective of matching the impedances throughout system 15 to thereby optimize power transfer between RF signal generator 185 and underground deposit 20.

One embodiment of impedance matching network 190 includes a first input 705 and a second input 710 that are each connected to receive electromagnetic energy from RF signal generator 185. The impedance matching network 190 also may include a first output 712 and a second output 713 that are each connected to provide electromagnetic energy to antenna 50 which, in turn, provides electromagnetic energy to underground deposit 20. The first input 705 is connected to a first terminal of a first variable capacitor 715 that extends between first input 705 and node 720. A second variable capacitor 725 extends between node 720 and first output 712. A variable conductor 730 extends between node 720 and a further node 735. The node 735 is common to both the second input 710 and second output 713. The values of the first variable capacitor 715, the second variable capacitor 725, and the variable conductor 730 may be controlled by multiphysics control system 55 to alter the value of $Z_{match}$ and achieve the desired power transfer characteristics.

Figure 8:
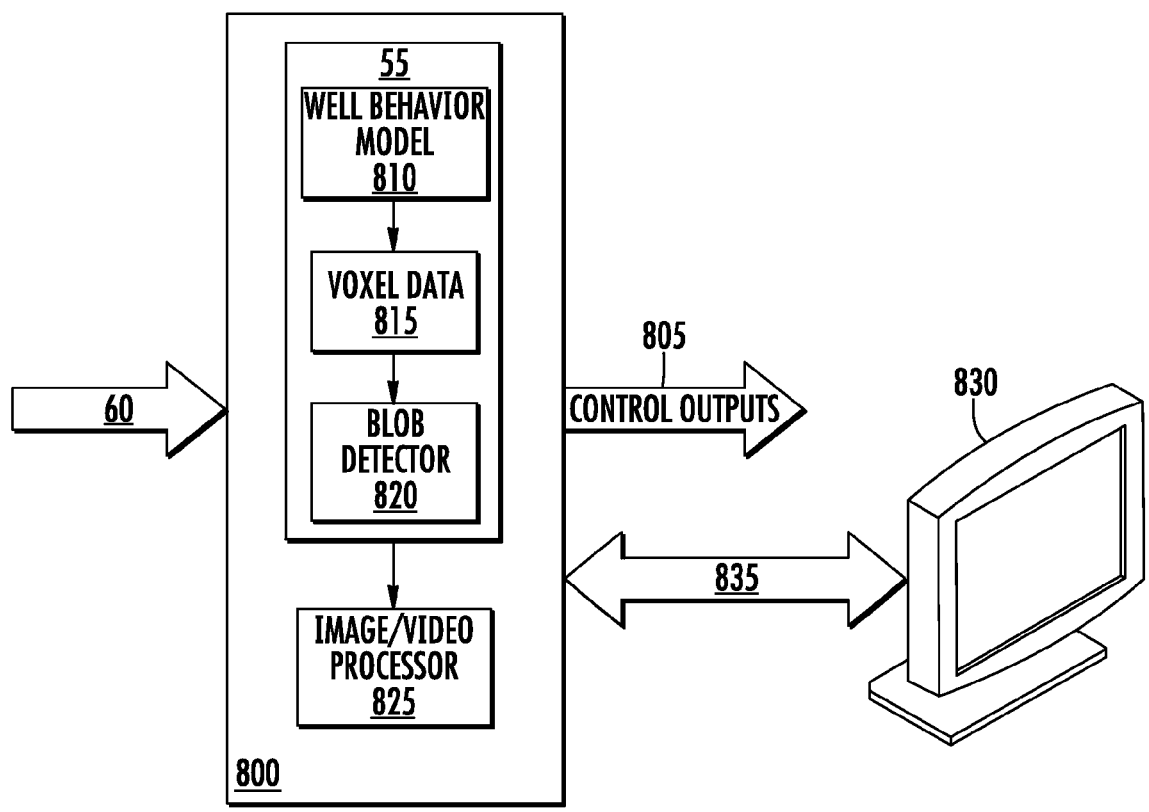
FIG. 8 shows one embodiment of a display system 800 that may be used to display a map of the characteristics of the underground deposit.

As shown at operation 385 of FIG. 3, multiphysics control system 55 may display characteristics of the underground deposit 20. FIG. 8 shows one embodiment of a display system 800 that may be used to display such characteristics. The display system 800 includes multiphysics control system 55 which is connected to receive the sensed/calculated data 60 and to provide control output signals 805.

As noted in FIG. 3, multiphysics control system 55 uses and maintains a well behavior model 810 having data corresponding to characteristics of underground deposit 20. Such characteristics may include, for example, electromagnetic characteristics, fluid dynamic characteristics, resource component saturation characteristics, and the like. The multiphysics control system 55 extracts characteristic data from the well behavior model 810 to generate voxel data 815. The voxel data 815 includes volume elements representing characteristics of underground deposit 20 in three-dimensional space. Voxels for different characteristics of the underground deposit 20 overlap one another in the same volumetric space thereby allowing the multiphysics control system 55 to generate spatial maps of the characteristics of the underground deposit 20.

To reduce the amount of voxel data 815 used to generate a spatial map, the multiphysics control system 55 may provide the voxel data 815 to a blob detector 820. Various blob detection techniques may be used by the blob detector 820 including, for example, Laplacian of Gaussian blob detection, Difference of Gaussians blob detection, and Determinant of Hessian blob detection. Other blob detection techniques may also be employed, the foregoing merely being examples.

Image data generated by the blob detector 820 may be provided to an image/video processor 825. The image/video processor 825 may execute image processing operations on the data including, for example, edge detection, color mapping, pixel mapping, or the like. The processed image data may be communicated to a terminal 830 along bus 835 for display to a user. The user may provide commands through terminal 830 to select which of the characteristics of the underground deposit 20 are to be displayed on the terminal 830. Additionally, or in the alternative, the output of blob detector 820 and/or the processed image data may be provided to a further controller that implements supplementary operational features of the system 15, such as image recognition to identify portions of interest in the image. These portions of interest may be used, for example, to identify critical areas of the underground deposit 20 needing attention.

Figure 9:
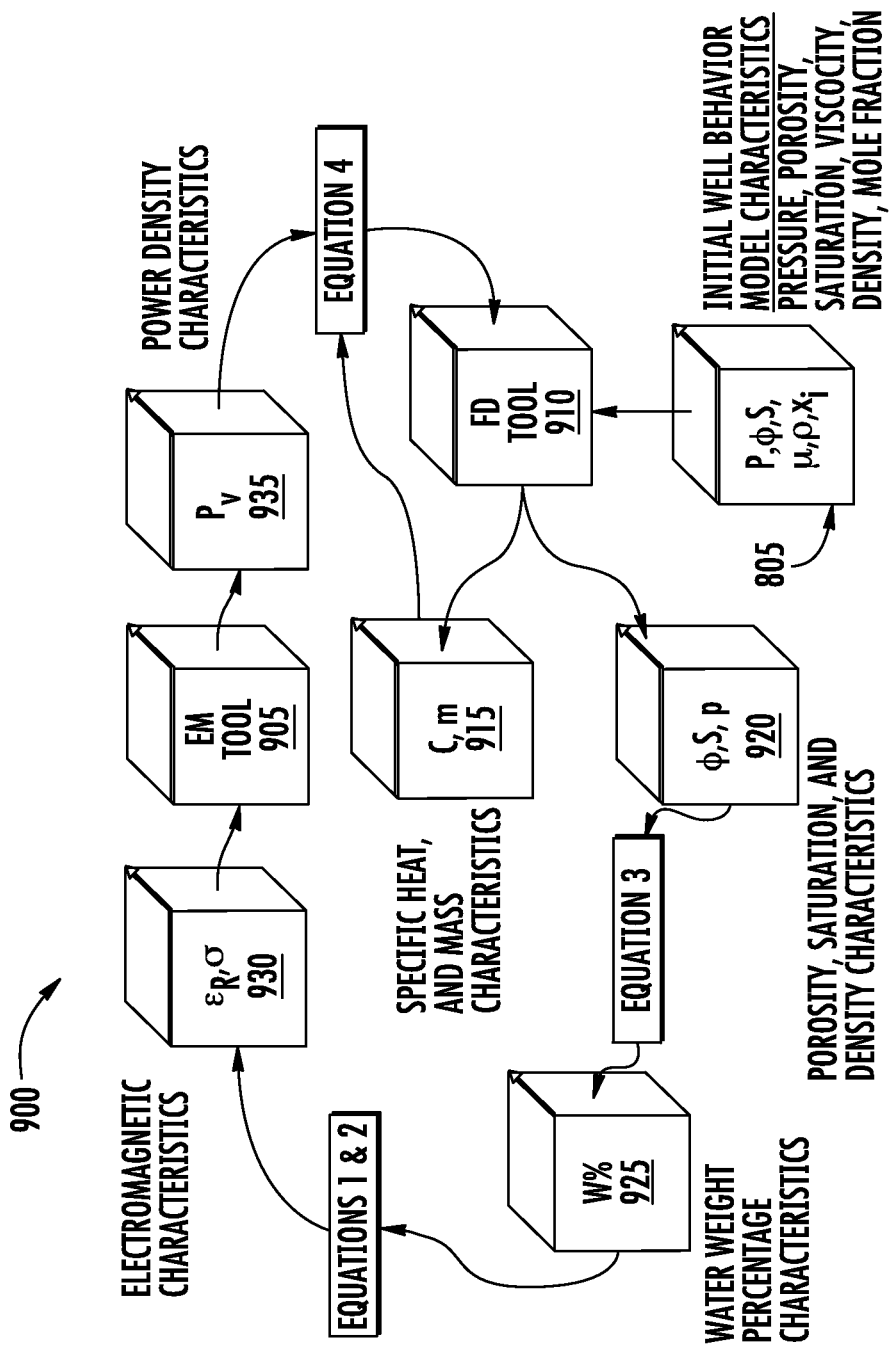
FIG. 9 is one embodiment of a voxel manipulation system 900 that may be used in the system shown in FIG. 8.

FIG. 9 is a voxel manipulation system 900 executed by the multiphysics control system 55 to generate the voxel data 815. Many of the operations executed by the voxel manipulation system 900 are used to simulate multiple physical models or multiple simultaneous physical phenomena occurring in underground deposit 20. The multiple physical models and/or multiple simultaneous physical phenomena typically involve coupled systems in which simulations for each system impacts the simulation of the other(s). The multiphysics tools used in the multiphysics control system 55 may solve partial differential equations for the coupled system to generate data corresponding to the characteristics of underground deposit 20.

The voxel manipulation system 900 of FIG. 9 includes two multiphysics processing tools that execute operations associated with two coupled systems of the underground deposit 20. In this embodiment, the voxel manipulation system 900 includes an electromagnetic tool 905 simulating the electromagnetic behavior of the underground deposit 20, and a fluid dynamics tool 910 simulating the fluid dynamic behavior of the underground deposit 20. Various partial differential equation solvers may be used to implement the electromagnetic tool 905 and fluid dynamics tool 910. For example, suitable multiphysics solvers are available from ANSYS, Inc., CPMSOL, Inc., and other providers.

The fluid dynamics tool 910 of FIG. 9 receives data from well behavior model 810. For example, well behavior model 810 may provide fluid dynamics tool 910 with pressure, porosity, saturation, viscosity, density, and mole fraction information. As discussed above, the data of well behavior model 810 may be based on an initial well behavior model as well as any updates made to that model. Updates may be based on real-time sensor data, recovered resource analysis, and/or data generated by the voxel manipulation system 900.

The fluid dynamic system modeled by the fluid dynamics tool 910 is coupled to the electromagnetic system modeled by electromagnetic tool 905. Accordingly, the fluid dynamic data provided by fluid dynamics tool 910 is dependent on values of the electromagnetic parameters modeled by electromagnetic tool 905. Using these inputs, fluid dynamics tool 910 generates specific heat voxels and mass characteristic voxels 915 modeling the underground deposit 20. The fluid dynamics tool 910 may also generate porosity voxels, saturation voxels, and density voxels 920. The density voxels 920, in turn, may be used to generate water weight percentage voxels 925.

The water weight percentage voxels 925 may be used to generate dielectric and conductivity voxels, shown collectively at 930. The conductivity voxels 930 are provided to the electromagnetic tool 905 to generate power density voxels 935. The power density voxels 935 and the mass characteristic voxels 915, in turn, are used to generate an input voxel to the fluid dynamics tool 910. Since the voxels modeling the electromagnetic system depend on voxels modeling the fluid dynamics system, and vice versa, voxel manipulation system 900 generates models for both of the coupled systems.

As shown in FIG. 9, there are several equations used to generate voxels of one characteristic and/or attribute from voxels of another characteristic and/or attribute. The voxel manipulation system 900 uses four such equations. Two equations are used at operation 940 to generate conductivity voxels 930 from water weight percentage voxels 925. In this example, conductivity voxels 930 are generated from the water weight percentage voxels 925 using Equation 1 below:

$$\sigma = 5 \cdot 10^{-4} \cdot w^2 \tag{1}$$

where w is the water weight percentage represented by the water weight percentage voxels 925 and corresponds to a water weight percentage between 0% and 100%.

Dielectric voxels 930 may be generated from the water weight percentage voxels 925 using Equation 2 below:

$$\varepsilon_{Ri}(w) = A_i + b_i w + c_i w^2 \tag{2}$$

where w is the water weight percentage represented by the water weight percentage voxels 925 and corresponds to a water weight percentage between 0% and 100%, and where $a_i$, $b_i$ and $c_i$ are coefficients that depend upon the frequency of operation of RF signal generator 185 and the materials in underground deposit 20. FIG. 10 is a table of the coefficients at various operating frequencies for Athabasca oil sands.

The water weight percentage voxels 925 may be generated from density voxels 920 at operation 945 using Equation 3 below:

$$w\% = 100 * \frac{\phi * \rho_w * S_w}{\phi * (\rho_w * S_w + \rho_o * S_o + \rho_g * S_g) + (1-\phi) * \rho_{rock}} \quad (3)$$

where $\phi$ is the porosity of the oil sands, $\rho_w$ is the water density, $S_w$ is the water saturation, $\rho_o$ is the oil density, $S_o$ is the oil saturation, $\rho_g$ is the gas density, $S_g$ is the gas saturation, and $\rho_{rock}$ is the rock density.

The fluid dynamics tool 910 may generate the density voxels 920 and mass characteristic voxels 915 at operation 950. At operation 950, the multiphysics control system 55 executes Equation 4 below, using the mass characteristic voxels 915 and the power density voxels 935 as inputs. The output of Equation 4 is provided as an input to fluid dynamics tool 910.

$$Q = c * m * \Delta T \quad (4)$$

where Q is the heat energy of the voxel is, c is the specific heat of the voxel, m is the mass of the voxel, and $\Delta T$ is the temperature change of the voxel over time. Although Equation 4 does not expressly use the power density voxels 935, the Q of each voxel corresponds to the power density represented by each of the power density voxels 935.

A user may select one or more of the underground deposit 20 characteristics shown in FIG. 9 for display on terminal 830. The multiphysics control system 55 may pass the voxels of the selected characteristic to blob detector 820 to ultimately generate a map of the characteristic on terminal 830. When well behavior model 810 is frequently updated, the map on terminal 830 represents a generally real-time display of the selected characteristic.

Figure 11:
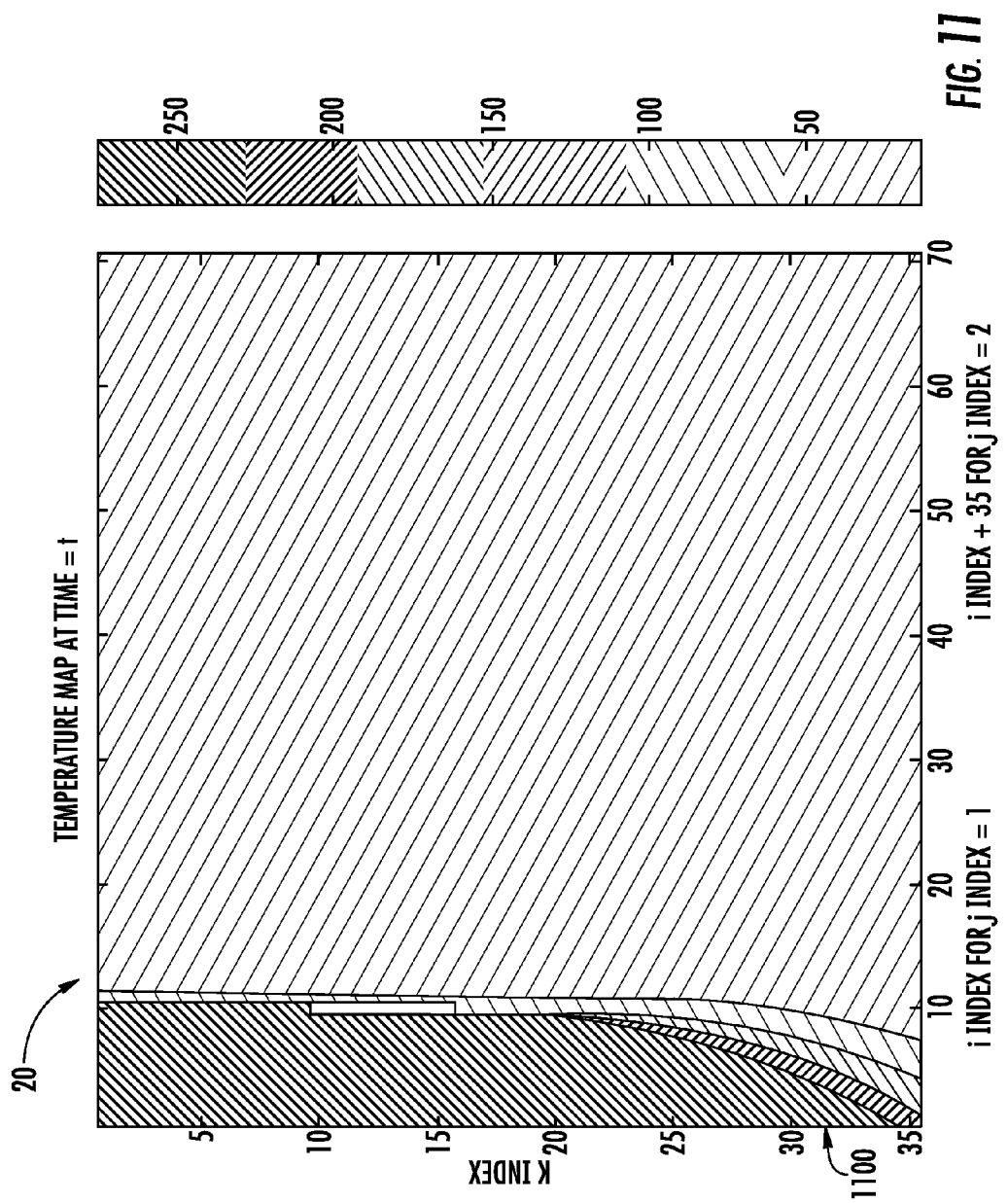
FIGS. 11 and 12 are examples of maps that may be displayed using the system shown in FIG. 8.
Figure 12:
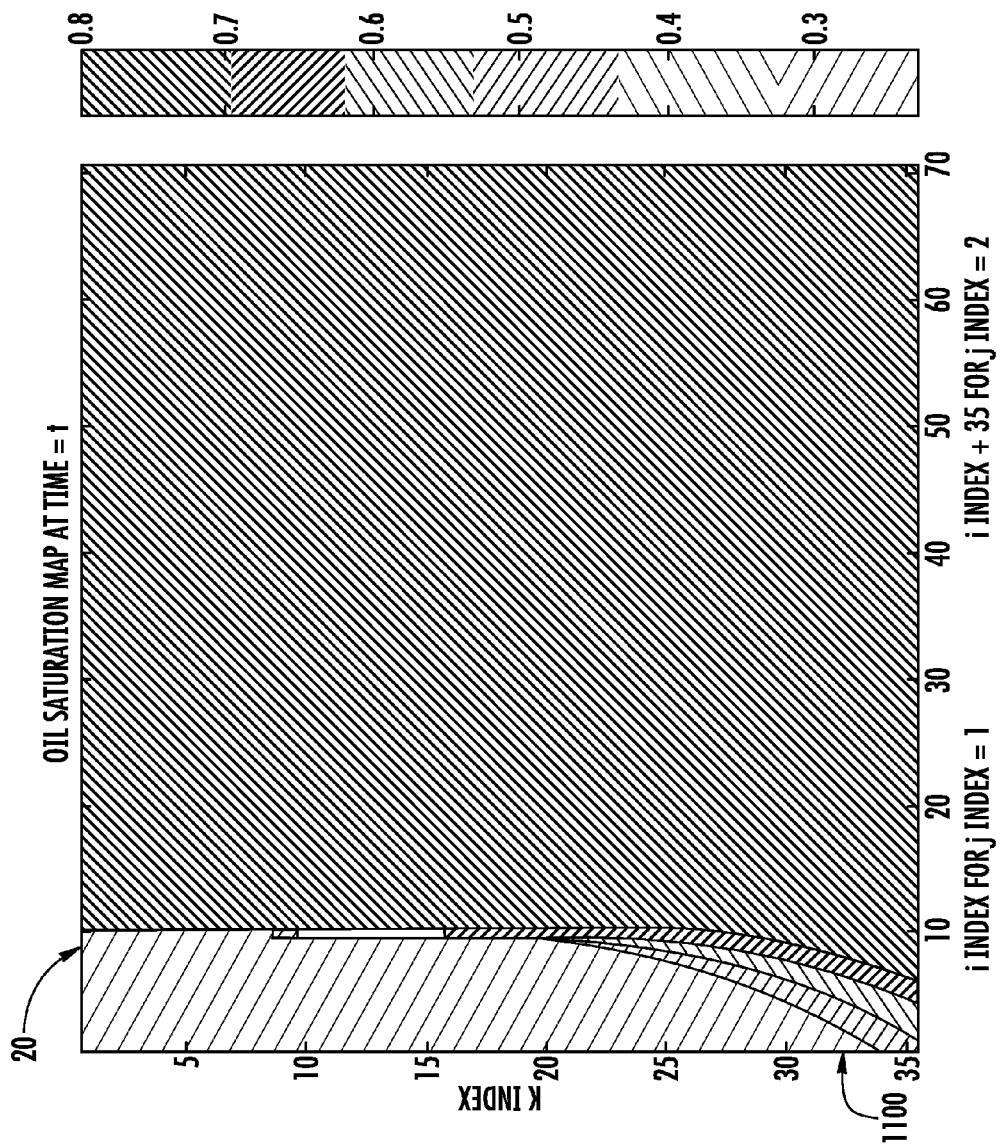

FIGS. 11 and 12 are examples of maps that may be displayed on terminal 830. FIG. 11 is a temperature map of the underground deposit 20 at a given time, t. Region 1100 is proximate the pressure 150 and delivery pipe 35 and, as such, has the highest temperature. The temperature decreases with distance from region 1100. FIG. 12 is an oil saturation map of underground deposit 20 at a given time, t. Again, region 1100 is proximate the pressure 150 and delivery pipe 35 and, as such, has the highest oil saturation. As noted above, other characteristics of underground deposit 20 may also be presented to a user on such maps.

Although preferred embodiments of the invention have been described using specific terms, devices, and methods, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of the various embodiments may be interchanged either in whole or in part. Therefore, the spirit and scope of the appended claims should not be limited to the description of the preferred versions contained herein.

The invention claimed is:

1. A system for providing an image related to an underground deposit during extraction of hydrocarbons comprising:
a multiphysics control system configured to
generate a well behavior model of the underground deposit subject to radio frequency heating,
update the well behavior model using at least one of real-time temperature and real-time pressure data correlated with predetermined water phase characteristics so that water in the underground deposit is maintained in a liquid state,
generate characteristic data for the underground deposit using the well behavior model,
generate voxels for the underground deposit using the characteristic data, and
execute blob detection operations on the voxels, and execute edge detection operations on an output of the blob detection operations;
a display; and
an image processor coupled to said multiphysics control system and said display and configured to provide image data to said display based upon the voxels.

2. The system of claim 1, wherein the characteristic data comprises electromagnetic characteristic data.

3. The system of claim 1, wherein the characteristic data comprises fluid dynamic characteristic data.

4. The system of claim 1, wherein the characteristic data comprises resource component saturation characteristic data.

5. The system of claim 1, wherein the blob detection operations comprise at least one of a Laplacian of Gaussian blob detection, a Difference of Gaussians blob detection, and a Determinant of Hessian blob detection.

6. The system of claim 1, wherein said multiphysics control system is configured to update the well behavior model using underground deposit data derived from an extracted resource analysis.

7. The system of claim 1, wherein the image processor is configured to generate a color map based on the voxels.

8. The system of claim 7, wherein the color map corresponds to a state of the one or more of the real-time temperature and real-time pressure data correlated with predetermined water phase characteristics of the underground deposit occurring at a given time.

9. The system of claim 1, wherein said multiphysics control system is configured to correlate fluid dynamic characteristics of the underground deposit with electromagnetic characteristics of the underground deposit.

10. The system of claim 1, wherein the multiphysics control system comprises a fluid dynamics tool and an electromagnetic tool.

11. The system of claim 10, wherein the fluid dynamics tool is configured to generate specific heat voxels and mass characteristic voxels for the underground deposit.

12. The system of claim 11, wherein the fluid dynamics tool is further configured to generate porosity voxels, saturation voxels, and density voxels; and wherein the electromagnetic tool is configured to simulate electromagnetic behavior of the underground deposit.

13. The system of claim 1, wherein the voxels comprise conductivity voxels based upon water weight percentage voxels.

14. The system of claim 1, wherein the voxels comprise dielectric voxels based upon water weight percentage voxels.

15. The system of claim 1, wherein the voxels comprise water weight percentage voxels based upon density voxels.

16. A system for providing an image related to an underground deposit during extraction of hydrocarbons comprising:
   a multiphysics control system configured to
      generate a well behavior model of the underground deposit subject to radio frequency heating,
      update the well behavior model using underground deposit data derived from an extracted resource analysis and using both real-time temperature and real-time pressure data correlated with predetermined water phase characteristics so that water in the underground deposit is maintained in a liquid state,
      generate characteristic data for the underground deposit using the well behavior model,
      generate voxels for the underground deposit using the characteristic data, and
      execute blob detection operations on the voxels, and execute edge detection operations on an output of the blob detection operations;
   a display; and
   an image processor coupled to said multiphysics control system and said display and configured to provide image data to said display based upon the voxels.

17. The system of claim 16, wherein the characteristic data comprises electromagnetic characteristic data.

18. The system of claim 16, wherein the characteristic data comprises fluid dynamic characteristic data.

19. The system of claim 16, wherein the characteristic data comprises resource component saturation characteristic data.

20. The system of claim 16, wherein said multiphysics control system comprises a fluid dynamics tool configured to generate porosity voxels, saturation voxels, and density voxels, and an electromagnetic tool configured to simulate electromagnetic behavior of the underground deposit.

21. A method for providing an image related to an underground deposit during extraction of hydrocarbons comprising:
   operating a multiphysics control system to
      generate a well behavior model of the underground deposit subject to radio frequency heating,
      update the well behavior model using at least one of real-time temperature and real-time pressure data correlated with predetermined water phase characteristics so that water in the underground deposit is maintained in a liquid state,
      generate characteristic data for the underground deposit using the well behavior model,
      generate voxels for the underground deposit using the characteristic data, and
      execute blob detection operations on the voxels, and execute edge detection operations on an output of the blob detection operations; and
   operating an image processor coupled to the multiphysics control system to provide image data to a display based upon the voxels.

22. The method of claim 21, wherein the characteristic data comprises electromagnetic characteristic data.

23. The method of claim 21, wherein the characteristic data comprises fluid dynamic characteristic data.

24. The method of claim 21, wherein the characteristic data comprises resource component saturation characteristic data.

25. The method of claim 21, wherein operating the multiphysics control system further comprises operating the multiphysics control system to update the well behavior model using underground deposit data derived from an extracted resource analysis.

* * * * *